(12) United States Patent  
Ware et al.

(10) Patent No.: US 11,487,679 B2  
(45) Date of Patent: *Nov. 1, 2022

(54) SEMICONDUCTOR MEMORY SYSTEMS WITH ON-DIE DATA BUFFERING

(71) Applicant: Rambus Inc., San Jose, CA (US)

(72) Inventors: Frederick A. Ware, Los Altos Hills, CA (US); Amir Amirkhany, Sunnyvale, CA (US); Suresh Rajan, Fremont, CA (US); Mohammad Hekmat, Mountain View, CA (US); Dinesh Patil, Sunnyvale, CA (US)

(73) Assignee: Rambus Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/081,909

(22) Filed: Oct. 27, 2020

(65) Prior Publication Data

US 2021/0141748 A1 May 13, 2021

Related U.S. Application Data

(63) Continuation of application No. 16/546,694, filed on Aug. 21, 2019, now Pat. No. 10,831,685, which is a (Continued)

(51) Int. Cl.
*G06F 13/14* (2006.01)
*G06F 13/16* (2006.01)
(Continued)

(52) U.S. Cl.
CPC ...... *G06F 13/1673* (2013.01); *G06F 13/4068* (2013.01); *G11C 5/02* (2013.01);
(Continued)

(58) Field of Classification Search
CPC ........................................................ G11C 7/10
(Continued)

(56) References Cited

U.S. PATENT DOCUMENTS 6,362,995 B1 3/2002 Moon et al.
7,464,225 B2 12/2008 Tsern
(Continued)

OTHER PUBLICATIONS

Kang et al, "8 GB 3-D DDR3 DRAM Using Through-Silicon-Via Technology," IEEE Journal of Solid-State Circuits, vol. 45., No. 1., Jan. 2010, pp. 111-119. 9 pages.
(Continued)

*Primary Examiner* — Hoai V Ho
(74) *Attorney, Agent, or Firm* — Lance Kreisman; Peninsula Patent Group

(57) ABSTRACT

A semiconductor memory system includes a first semiconductor memory die and a second semiconductor memory die. The first semiconductor memory die includes a primary data interface to receive an input data stream during write operations and to deserialize the input data stream into a first plurality of data streams, and also includes a secondary data interface, coupled to the primary data interface, to transmit the first plurality of data streams. The second semiconductor memory die includes a secondary data interface, coupled to the secondary data interface of the first semiconductor memory die, to receive the first plurality of data streams.

20 Claims, 31 Drawing Sheets

Related U.S. Application Data continuation of application No. 15/333,001, filed on Oct. 24, 2016, now Pat. No. 10,402,352, which is a continuation of application No. 14/683,080, filed on Apr. 9, 2015, now Pat. No. 9,501,433, which is a continuation of application No. 14/023,970, filed on Sep. 11, 2013, now Pat. No. 9,009,400.

(60) Provisional application No. 61/714,666, filed on Oct. 16, 2012.

(51) Int. Cl.
| | |
|---|---|
| *G11C 7/10* | (2006.01) |
| *G11C 8/18* | (2006.01) |
| *G11C 11/419* | (2006.01) |
| *G11C 7/22* | (2006.01) |
| *G11C 11/4076* | (2006.01) |
| *G11C 11/4093* | (2006.01) |
| *G11C 11/4096* | (2006.01) |
| *G11C 5/02* | (2006.01) |
| *G06F 13/40* | (2006.01) |
| *G11C 29/02* | (2006.01) |

(52) U.S. Cl.
CPC ............... *G11C 7/10* (2013.01); *G11C 7/106* (2013.01); *G11C 7/1012* (2013.01); *G11C 7/1021* (2013.01); *G11C 7/1066* (2013.01); *G11C 7/1072* (2013.01); *G11C 7/1087* (2013.01); *G11C 7/1093* (2013.01); *G11C 7/222* (2013.01); *G11C 8/18* (2013.01); *G11C 11/4076* (2013.01); *G11C 11/4093* (2013.01); *G11C 11/4096* (2013.01); *G11C 11/419* (2013.01); *G11C 29/022* (2013.01); *G11C 29/023* (2013.01); *G11C 29/028* (2013.01)

(58) Field of Classification Search
USPC ........................................................ 710/305
See application file for complete search history.

(56) References Cited

U.S. PATENT DOCUMENTS

| | | | |
|---|---|---|---|
| 7,698,470 | B2 | 4/2010 | Ruckerbauer et al. |
| 7,702,874 | B2 | 4/2010 | Vogt |
| 7,796,446 | B2 | 9/2010 | Ruckerbauer et al. |
| 7,995,365 | B1 | 8/2011 | D'Ambrosio et al. |
| 8,031,505 | B2 | 10/2011 | Kang et al. |
| 9,009,400 | B2 * | 4/2015 | Ware .................... G11C 7/1087 |
| | | | 711/105 |
| 9,501,433 | B2 * | 11/2016 | Ware ........................ G11C 8/18 |
| 10,402,352 | B2 | 9/2019 | Ware et al. |
| 2004/0186956 | A1 | 9/2004 | Perego et al. |
| 2004/0225862 | A1 | 11/2004 | Deur et al. |
| 2006/0291263 | A1 | 12/2006 | Wallner et al. |
| 2006/0294295 | A1 | 12/2006 | Fukuzo |
| 2007/0001299 | A1 | 1/2007 | Kikuchi et al. |
| 2009/0019195 | A1 | 1/2009 | Djordjevic |
| 2009/0039915 | A1 | 2/2009 | Ruckerbauer |
| 2009/0113078 | A1 | 4/2009 | Schnell et al. |
| 2009/0268539 | A1 | 10/2009 | Ruckerbauer et al. |
| 2010/0020583 | A1 | 1/2010 | Kang et al. |
| 2010/0082857 | A1 | 4/2010 | Klein |
| 2011/0026293 | A1 | 2/2011 | Riho |
| 2011/0156232 | A1 | 6/2011 | Youn et al. |
| 2011/0292708 | A1 | 12/2011 | Kang et al. |
| 2012/0059984 | A1 | 3/2012 | Kang et al. |
| 2012/0099389 | A1 | 4/2012 | Park et al. |
| 2012/0196402 | A1 | 8/2012 | Coteus et al. |
| 2012/0300528 | A1 | 11/2012 | Kang et al. |
| 2013/0007350 | A1 * | 1/2013 | D'Abreu ............. G06F 11/1072 |
| | | | 711/103 |
| 2013/0148402 | A1 | 6/2013 | Chang et al. |
| 2013/0159766 | A1 | 6/2013 | D'Abreu et al. |
| 2014/0006730 | A1 * | 1/2014 | Zain .................... G06F 13/1694 |
| | | | 711/155 |

OTHER PUBLICATIONS

Kang et al., "8Gb 3D DDR3 DRAM Using Through-Silicon-Via Technology," ISSCC 2009, Session7, 2009 IEEE International Solid-State Circuits Conference, pp. 130-132, Feb. 10, 2009. 3 pages.

* cited by examiner

1650

At a first semiconductor memory die coupled to one or more additional semiconductor die: (1652)

During read operations directed at a respective semiconductor memory die of the one or more additional semiconductor memory die, receive data from the respective semiconductor memory die at a secondary data interface. (1654)

Receive a plurality of data streams (e.g., two SDR data streams). (1656)

The first semiconductor memory die is situated in a first semiconductor package. The respective semiconductor die is situated in a second semiconductor package stacked with the first semiconductor package in a package-on-package configuration. (1658)

Serialize the plurality of data streams into an output data stream (e.g., into a DDR data stream). (1660)

Transmit the data (e.g., the output data stream) from a primary data interface (e.g., to a memory controller). (1662)

FIG. 16B

SEMICONDUCTOR MEMORY SYSTEMS WITH ON-DIE DATA BUFFERING

RELATED APPLICATIONS

This application is a Continuation of U.S. patent application Ser. No. 16/546,694, filed Aug. 21, 2019, entitled SEMICONDUCTOR MEMORY SYSTEMS WITH ON-DIE DATA BUFFERING, which is a Continuation of U.S. patent application Ser. No. 15/333,001, filed Oct. 24, 2016, entitled SEMICONDUCTOR MEMORY SYSTEMS WITH ON-DIE DATA BUFFERING, now U.S. Pat. No. 10,402,352, which is a Continuation of U.S. patent application Ser. No. 14/683,080, filed Apr. 9, 2015, entitled SEMICONDUCTOR MEMORY SYSTEMS WITH ON-DIE DATA BUFFERING, now U.S. Pat. No. 9,501,433, which is a Continuation of U.S. patent application Ser. No. 14/023,970, filed Sep. 11, 2013, entitled SEMICONDUCTOR MEMORY SYSTEMS WITH ON-DIE DATA BUFFERING, now U.S. Pat. No. 9,009,400, and which claims the benefit of priority under 35 U.S.C. 119(e) to Provisional Application Ser. No. 61/714,666, filed Oct. 16, 2012, entitled SEMICONDUCTOR MEMORY SYSTEMS WITH ON-DIE DATA BUFFERING, all of which are incorporated herein by reference in their entirety for all purposes.

TECHNICAL FIELD

The present embodiments relate generally to semiconductor memories, and specifically to semiconductor memories with on-die data buffering.

BACKGROUND

The storage capacity of a semiconductor memory system can be increased by increasing the number of semiconductor memory die in the system. Increasing the number of semiconductor memory die, however, presents significant engineering challenges. For example, increasing the number of die coupled to a signal line in a data bus increases the capacitive loading (e.g., the pin capacitance) for the signal line and thus decreases the maximum rate at which data can be transmitted over the signal line.

Accordingly, there is a need for effective techniques for buffering data transmission in a semiconductor memory system.

BRIEF DESCRIPTION OF THE DRAWINGS

The present embodiments are illustrated by way of example and are not intended to be limited by the figures of the accompanying drawings.

FIG. 16B is a flowchart of a method of performing read operations in a memory system in accordance with some embodiments.

Like reference numerals refer to corresponding parts throughout the drawings and specification.

DETAILED DESCRIPTION

Figure 1:
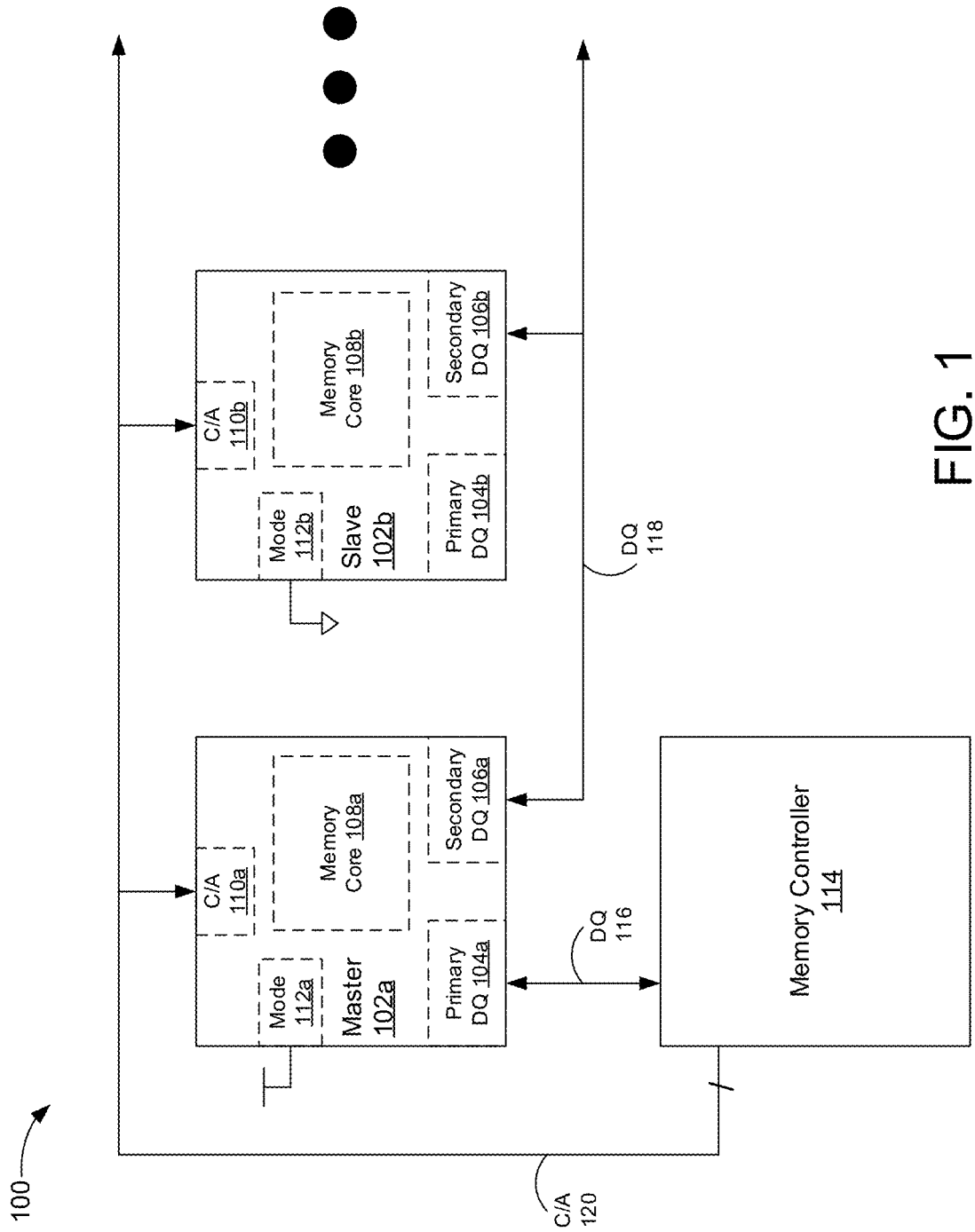
FIG. 1 is a block diagram of a semiconductor memory system that includes a semiconductor memory die configured as a master memory die and one or more semiconductor memory die configured as slave memory die in accordance with some embodiments.

Embodiments are disclosed in which a first semiconductor memory die, referred to as a master memory die, buffers data for a second semiconductor memory die, referred to as a slave memory die.

In some embodiments, a semiconductor memory system includes a first semiconductor memory die and a second semiconductor memory die. The first semiconductor memory die includes a primary data interface to receive an input data stream during write operations and to deserialize the input data stream into a first plurality of data streams, and also includes a secondary data interface, coupled to the primary data interface, to transmit the first plurality of data streams. The second semiconductor memory die includes a secondary data interface, coupled to the secondary data interface of the first semiconductor memory die, to receive the first plurality of data streams.

In some embodiments, a method performed at a first semiconductor memory die includes receiving an input data stream at a primary data interface during write operations, deserializing the input data stream into a plurality of data streams, and transmitting the plurality of data streams from a secondary data interface to one or more additional semiconductor memory die.

In some embodiments, a semiconductor memory die includes a primary data interface to receive an input data stream during write operations and to deserialize the input data stream into a first plurality of data streams, and also includes a secondary data interface, coupled to the primary data interface, to transmit the first plurality of data streams.

In some embodiments, a semiconductor memory system includes a first semiconductor package and a second semiconductor package stacked with the first semiconductor package in a package-on-package configuration. The first semiconductor package includes a first semiconductor memory die that includes a primary data interface to receive data during write operations and a secondary data interface, coupled to the primary data interface, to retransmit the data. The second semiconductor package includes a second semiconductor memory die that includes a secondary data interface, coupled to the secondary data interface of the first semiconductor memory die, to receive the retransmitted data.

In some embodiments, a method is performed in a first semiconductor die situated in a first semiconductor package. In the method, data is received at a primary data interface die during write operations. The data is retransmitted from a secondary data interface to one or more additional semiconductor memory die. The one or more additional semiconductor memory die include at least one additional semiconductor memory die in a second semiconductor package stacked with the first semiconductor package in a package-on-package configuration.

In some embodiments, a semiconductor package includes a semiconductor memory die that includes a primary data interface to receive data during write operations and a secondary data interface, coupled to the primary data interface, to retransmit the data. The semiconductor package also includes a package substrate on which the semiconductor memory die is mounted; a first conductive pad situated on a bottom side of the package substrate and coupled to the primary data interface, to provide the data to the primary data interface; and a second conductive pad situated on a top side of the package substrate and coupled to the secondary data interface, to convey at least a portion of the retransmitted data.

Reference will now be made in detail to various embodiments, examples of which are illustrated in the accompanying drawings. In the following detailed description, numerous specific details are set forth in order to provide a thorough understanding of the disclosure. However, some embodiments may be practiced without these specific details. In other instances, well-known methods, procedures, components, and circuits have not been described in detail so as not to unnecessarily obscure aspects of the embodiments.

FIG. 1 is a block diagram of a semiconductor memory system 100 that includes a master semiconductor memory die 102a and one or more slave semiconductor memory die 102b in accordance with some embodiments. (The term die as used herein may be either singular or plural, depending on the context.) In some embodiments, the memory die 102a and 102b are dynamic random-access memories (DRAM). The memory system 100 also includes a memory controller 114 coupled to the memory die 102a and 102b.

The master memory die 102a includes a primary data (DQ) interface 104a, a secondary data (DQ) interface 106a, a command and address (C/A) interface 110a, a mode configuration interface 112a, and a memory core 108a. The memory core 108a includes an array of memory cells (e.g., DRAM cells) for storing data. Each slave memory die 102b includes a secondary data (DQ) interface 106b, a command and address (C/A) interface 110b, a mode configuration interface 112b, a memory core 108b, and an optional primary data (DQ) interface 104b, which is disabled. Each memory core 108b, like the memory core 108a, includes an array of memory cells (e.g., DRAM cells) for storing data.

The memory controller 114 transmits commands (e.g., memory access commands and their associated addresses) to the memory die 102a and 102b through a C/A bus 120. In the example of FIG. 1, the C/A bus 120 has a multi-drop, fly-by architecture. In some embodiments, the C/A bus 120 includes a separate chip-select (CS) signal line for each memory die 102a and 102b. Each CS signal line conveys a CS signal to its respective memory die 102a or 102b. A respective CS signal, when asserted, allows the corresponding memory die 102a or 102b to execute a command received over the C/A bus 120, and thus qualifies the command. For example, each memory die 102a and 102b may receive a command (e.g., a memory access command) in parallel, but only the memory die 102a or 102b for which the corresponding CS signal has been asserted performs the operation specified by the command. Each memory die 102a and 102b receives the C/A signals (including its CS signal) through its C/A interface 110a or 110b. In some embodiments, the C/A bus 120 from the memory controller may be received by an address buffer (e.g. an address register integrated circuit) that re-transmits the command and address information to the memory die 102a and 102b.

The primary data interface 104a of the master memory die 102a is coupled directly to the memory controller 114 by a data (DQ) signal line 116. The data signal line 116 provides data (e.g., an input data stream) from the memory controller 114 to the master memory die 102a during write operations and provides data (e.g., an output data stream) from the master memory die 102a to the memory controller 114 during read operations (e.g., during column access operations performed in response to a column access (CAS) command). The primary data interface 104a is coupled within the master memory die 102a to the secondary data interface 106a. One or more (e.g., a plurality of) external data (DQ) signal lines 118 couple the secondary interface 106a to the secondary interface 106b of each slave memory die 102b.

During write operations, the memory controller 114 transmits write data to the primary data interface 104a over the signal line 116. The data received at the primary data interface 104a is provided to the secondary data interface 106a, which forwards the data to the secondary data interface 106b of each slave memory die 102b. In some embodiments, the data received at the primary data interface 104a is deserialized into a plurality of data streams; the secondary data interface 106a transmits the data streams to the secondary data interface 106b of each slave memory die 102b over respective signal lines 118. For example, the primary data interface 104a receives write data from the memory controller 114 at double data rate (DDR) and deserializes the write data into two single-data-rate (SDR) data streams, which the secondary data interface 106a transmits to the slave memory die 102b over two signal lines 118. Each of the signal lines 118 conveys one of the SDR data streams. In some embodiments, write data is only provided from the primary data interface 104a to the secondary data interface 106a and forwarded to the slave memory die 102b for write commands that are not directed to the master memory die 102a. If a write command is directed to the master memory die 102a (e.g., as indicated by assertion of the CS signal for the master memory die 102a), the write data is provided to the memory core 108a instead.

During read operations (e.g., column access operations) performed by a respective slave memory die 102b, data is transmitted from the secondary data interface 106b of the respective slave memory die 102b to the secondary data interface 106a of the master memory die 102a. From there, the data is provided to the primary data interface 104a and forwarded to the memory controller 114 over the signal line 116. In some embodiments, the data is transmitted from the secondary data interface 106b to the secondary data interface 106a in a plurality of data streams, which are serialized in the master memory die 102a. The serialized data is then forwarded to the memory controller 114 over the signal line 116. For example, the secondary data interface 106b transmits two SDR data streams to the secondary data interface 106a, with each SDR data stream being transmitted over a respective signal line 118. The master memory die 102a serializes the two SDR data streams into a single DDR output data stream that the primary data interface 104a transmits onto the signal line 116.

In some embodiments, the data signal line 116 is one of a number of data signal lines that compose a data bus (or a portion of a data bus) coupling the memory controller 114 with the master memory die 102a. The master memory die 102a includes a separate primary data interface 104a coupled to each data signal line of the data bus and a separate secondary data interface 106a coupled to each primary data interface 104a. Each slave memory die 102b includes a separate secondary data interface 106b coupled to a corresponding secondary data interface 106a by one or more (e.g., two) signal lines 118. In some embodiments, each slave memory die 102b also includes a number of primary data interfaces 104b equal to the number of primary data interfaces 104a; the primary data interfaces 104b are disabled and are not connected to external signal lines. The data bus may also include one or more signal lines that convey data strobe (DQS) signals. For example, the data bus may include one data strobe signal line for every two data signal lines 116. A data strobe signal may be shared between multiple (e.g., two) primary data interfaces 104a in the master memory die 102a.

In some embodiments, the same die may be configured as either the master memory die 102a or a slave memory die 102b. If configured as a slave memory die 102b, its primary data interfaces 104b are disabled. In the example of FIG. 1, each die 102a and 102b is configured using a mode configuration interface 112a or 112b. The master memory die 102a is configured as master by coupling its mode configuration interface 112a to a power supply, while each slave memory die 102b is configured as a slave by coupling its mode configuration interface 112b to ground (or vice-versa). Other configuration methods include, but are not limited to, blowing fuses in the memory die 102a and 102b and programming configuration registers in the memory die 102a and 102b.

In some embodiments, the master memory die 102a is configured to have a greater latency for providing data in response to read commands directed to it than the slave memory die 102b, to ensure uniform latency from the perspective of the memory controller 114 regardless of the memory die 102a or 102b to which a read command is directed. For example, if buffering and retransmitting data from a slave memory die 102b takes a specified number of clock cycles, the master memory die 102a internally delays a read command directed to it by the same number of cycles, to ensure that the memory controller 114 receives read data in the same cycle, regardless of which memory die 102a or 102b performs the read operation. Similarly, in some embodiments the master memory die 102a is configured to latch write data earlier than the slave memory die 102b and to store the write data for a specified number of cycles (e.g., for a number of cycles equal to the delay in re-transmitting the write data from the master memory die 102a to the slave memory die 102b) before writing the data to its memory core 108a. This delay ensures that write operations occur in the same clock cycle regardless of the memory die 102a or 102b to which they are directed.

The system 100 thus uses the master memory die 102a to buffer data being transmitted between the memory controller 114 and slave memory die 102b. This buffering allows the slave memory die 102b to be coupled to the memory controller 114 without being directly connected to the memory controller 114 through data lines 116. The capacitive loading on the data lines 116 is reduced, which increases the maximum rate of data transmission in the system 100. The system 100 also avoids using data buffer integrated circuits (ICs) separate from the memory die 102a and 102b, thereby reducing cost and simplifying circuit board routing.

In some embodiments, the system 100 may include two or more memory die 102a and/or 102b stacked on a package substrate in a semiconductor package. Furthermore, the system 100 may include multiple semiconductor packages, each with multiple memory die 102a and/or 102b (e.g., multiple stacked memory die). In some embodiments, some or all of the multiple semiconductor packages are stacked in a package-on-package (POP) configuration.

Figure 2A:
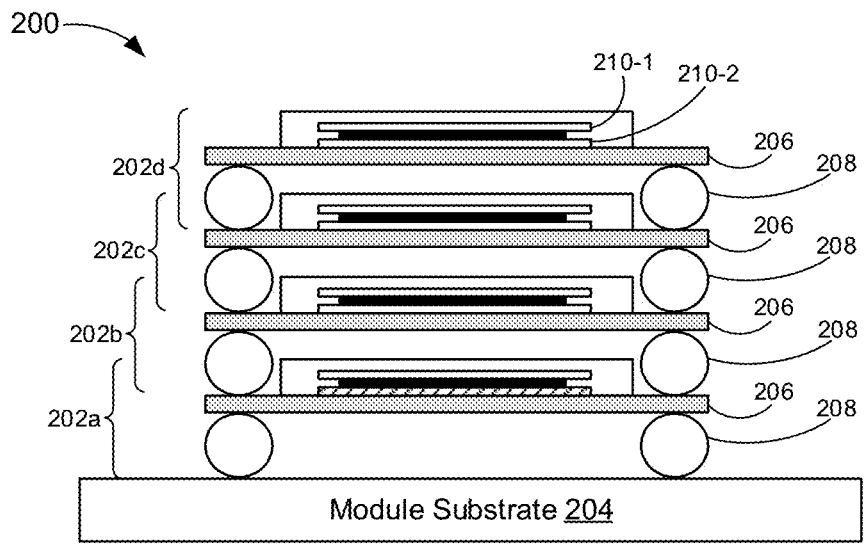
FIGS. 2A and 2B are cross-sectional views of systems in which multi-die packages are stacked in a package-on-package (POP) configuration and mounted on a module substrate in accordance with some embodiments.

FIG. 2A is a cross-sectional view of a system 200 in which four packages 202a, 202b, 202c, and 202d are stacked in a POP configuration and mounted on a module substrate 204 in accordance with some embodiments. The system 200 is an example of a portion of the system 100 (FIG. 1). In some embodiments, the module substrate 204 is the substrate of a dual-inline memory module (DIMM). Each of the packages 202a-d includes two memory die 210-1 and 210-2 stacked on a package substrate 206. One of the memory die (e.g., the memory die 210-2 of the package 202a, which is the bottommost memory die) is configured as the master memory die 102a (FIG. 1). The other memory die (e.g., the die 210-1 of the package 202a and the die 210-1 and 210-2 of the packages 202b-d) are configured as slave memory die 102b (FIG. 1).

Each of the packages 202a-d also includes pins 208. (The term pin as used herein includes pins, balls, lands, bumps, micro-bumps, and any other contacts suitable for electrically connecting a semiconductor package to a circuit board or other underlying substrate.) Respective pins 208 connect each one of the packages 202b-d to the package directly beneath it. The pins 208 of the package 202a connect the package 202a to the module substrate 204; the package 202a is thus mounted directly on the module substrate 204. Signal lines (not shown) in the module substrate 204 couple the packages 202a-d to a memory controller (not shown). In some embodiments, the memory controller is mounted on a circuit board separate from and coupled to the module substrate 204.

The configuration of the packages 202a-d in the system 200 is called a 4×2 POP configuration. In general, a stack of m packages that each include n die is called an m×n POP configuration.

Figure 2B:
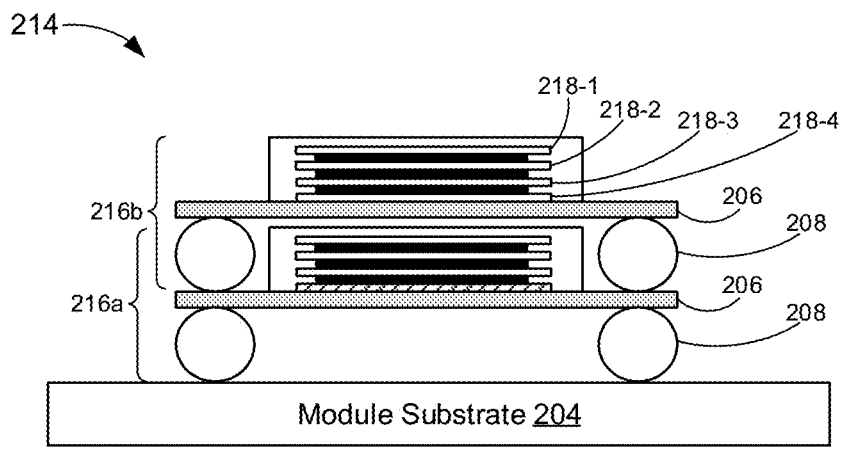

FIG. 2B is a cross-sectional view of a system 214 in which two packages 216a and 216b are stacked in a 2×4 POP configuration and mounted on a module substrate 204 in accordance with some embodiments. The system 214 is an example of a portion of the system 100 (FIG. 1). Each of the packages 216a-b includes four memory die 218-1 through 218-4 stacked on a package substrate 206. One of the memory die (e.g., the memory die 218-4 of the package 216a, which is the bottommost memory die) is configured as the master memory die 102a (FIG. 1). The other memory die (e.g., the die 218-1 through 218-3 of the package 216a and the die 218-1 through 218-4 of the package 216b) are configured as slave memory die 102b (FIG. 1). Each of the packages 216a and 216b also includes pins 208. The pins 208 of the package 216b connect the package 216b to the package 216a beneath it. The pins 208 of the package 216a connect the package 216a to the module substrate 204.

Figure 2C:
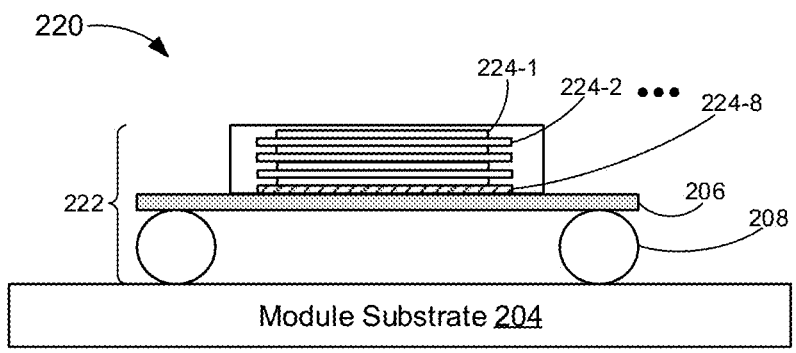
FIG. 2C is a cross-sectional view of a system in which a single package that includes eight memory die is mounted on a module substrate in accordance with some embodiments.

FIG. 2C is a cross-sectional view of a system 220 in which a single package 222 that includes eight memory die 224-1 through 224-8 is mounted on a module substrate 204 in accordance with some embodiments. The system 220 is an example of a portion of the system 100 (FIG. 1). The eight memory die 224-1 through 224-8 are stacked on a package substrate 206, which is connected to the module substrate 204 by pins 208. One of the memory die (e.g., the memory die 224-8, which is the bottommost memory die) is configured as the master memory die 102a (FIG. 1). The other memory die (e.g., the die 224-1 through 224-7) are configured as slave memory die 102b (FIG. 1).

In some embodiments, the system 100 (FIG. 1) may include multiple semiconductor packages situated in different locations on a circuit board (e.g., a module substrate). Furthermore, each package may include multiple memory die 102a and/or 102b (e.g., multiple stacked memory die). Alternatively, each package may include a single memory die 102a or 102b (FIG. 1).

Figure 2D:
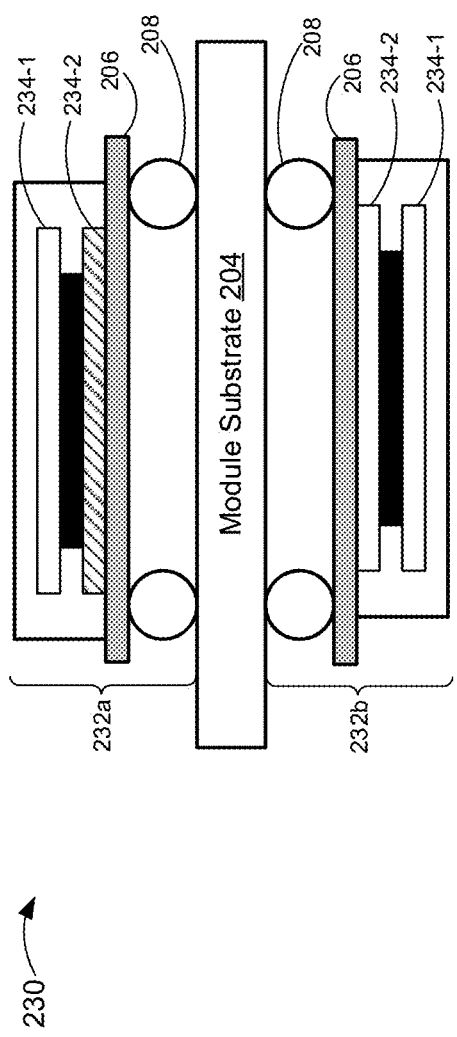
FIGS. 2D and 2E are cross-sectional views of systems in which multi-die packages are situated in different locations on a module substrate in accordance with some embodiments.

FIG. 2D is a cross-sectional view of a system 230 in which two semiconductor packages 232a and 232b are mounted on a module substrate 204 in accordance with some embodiments. The system 230 is an example of a portion of the system 100 (FIG. 1). The semiconductor packages 232a and 232b are situated opposite to each other on opposing sides of the module substrate 204 in a clam-shell configuration. Each of the packages 232a and 232b includes two stacked memory die 234-1 and 234-2. One of the memory die (e.g., the memory die 234-2 of the package 232a) is configured as the master memory die 102a (FIG. 1). The other memory die (e.g., the die 234-1 of the package 232a and the die 234-1 and 234-2 of the package 232b) are configured as slave memory die 102b (FIG. 1).

Figure 2E:
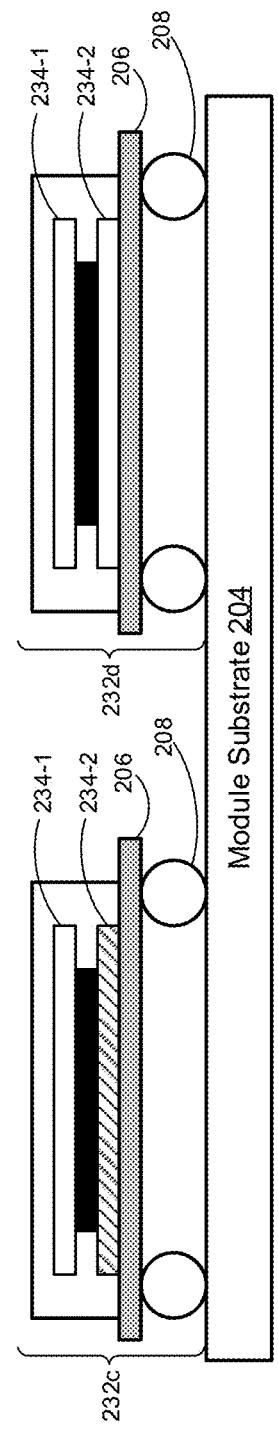

FIG. 2E is a cross-sectional view of another system 236 (e.g., another example of a portion of the system 100, FIG. 1) in which two semiconductor packages 232c and 232d are mounted on a module substrate 204 in accordance with some embodiments. The semiconductor packages 232c and 232d are situated in adjacent sites on the same side of the module substrate 204. (Alternatively, the packages 232c and 232d may be situated in non-adjacent sites on the same side or opposite sides of the module substrate 204). For example, the packages 232c and 232d may be situated in adjacent sites in a row of semiconductor packages mounted on the module substrate 204. In another example, the module substrate 204 may include multiple rows of semiconductor packages, and the packages 232c and 232d may be situated in adjacent sites in a column of packages on the module substrate 204. Each of the packages 232c and 232d includes two stacked memory die 234-1 and 234-2. One of the memory die (e.g., the memory die 234-2 of the package 232c) is configured as the master memory die 102a (FIG. 1). The other memory die (e.g., the die 234-1 of the package 232c and the die 234-1 and 234-2 of the package 232d) are configured as slave memory die 102b (FIG. 1).

Figure 2F:
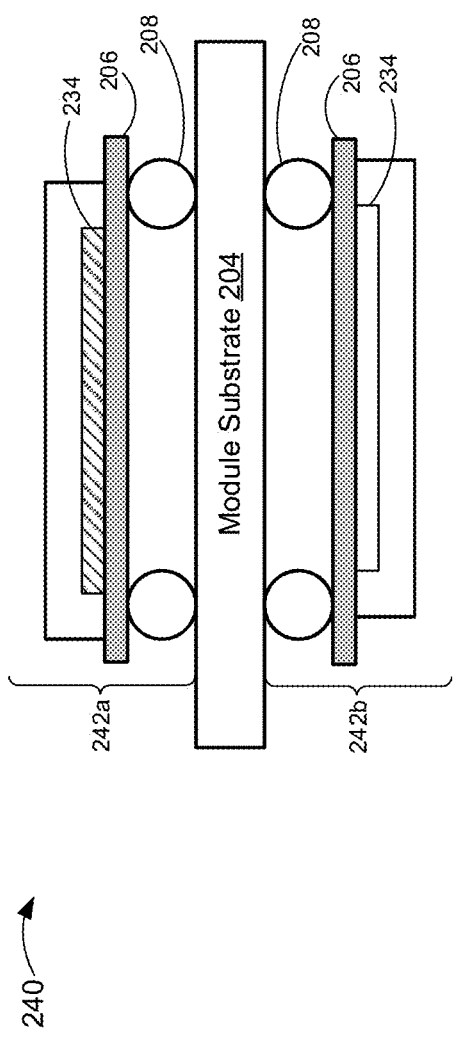
FIGS. 2F and 2G are cross-sectional views of systems in which single-die packages are situated in different locations on a module substrate in accordance with some embodiments.

FIG. 2F is a cross-sectional view of yet another system 240 (e.g., a portion of the system 100, FIG. 1) in which two semiconductor packages 242a and 242b are mounted on a module substrate 204 in accordance with some embodiments. The semiconductor packages 242a and 242b are situated opposite to each other on opposing sides of the module substrate 204 in a clam-shell configuration. Each of the packages 242a and 242b includes a single memory die 234. One of the memory die (e.g., the memory die 234 of the package 242a) is configured as the master memory die 102a (FIG. 1), while the other memory die (e.g., the die 234 of the package 242b) is configured as slave memory die 102b (FIG. 1).

Figure 2G:
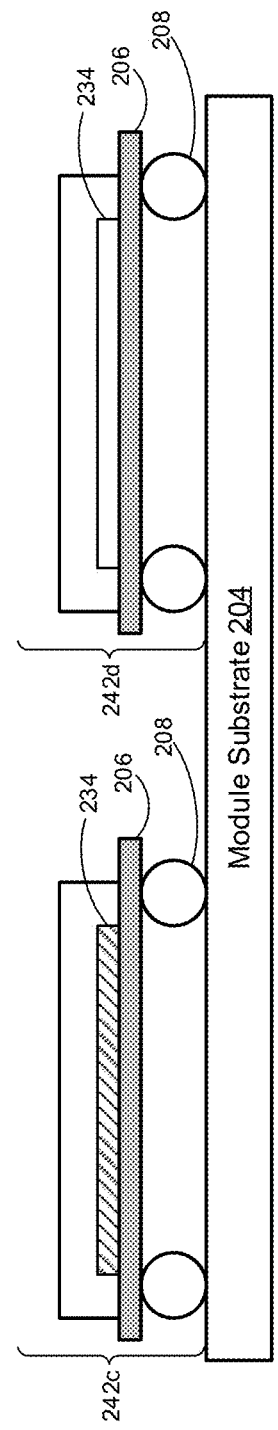

FIG. 2G is a cross-sectional view of still another system 250 (e.g., a portion of the system 100, FIG. 1) in which two semiconductor packages 242c and 242d are mounted on a module substrate 204 in accordance with some embodiments. The semiconductor packages 242c and 242d are situated in adjacent sites (e.g., in the same row or column of semiconductor packages) on the same side of the module substrate 204. Each of the packages 242c and 242d includes a single memory die 234, one of which (e.g., the memory die 234 of the package 242c) is configured as the master memory die 102a (FIG. 1) and the other of which (e.g., the die 234 of the package 242d) is configured as a slave memory die 102b (FIG. 1).

Figure 3:
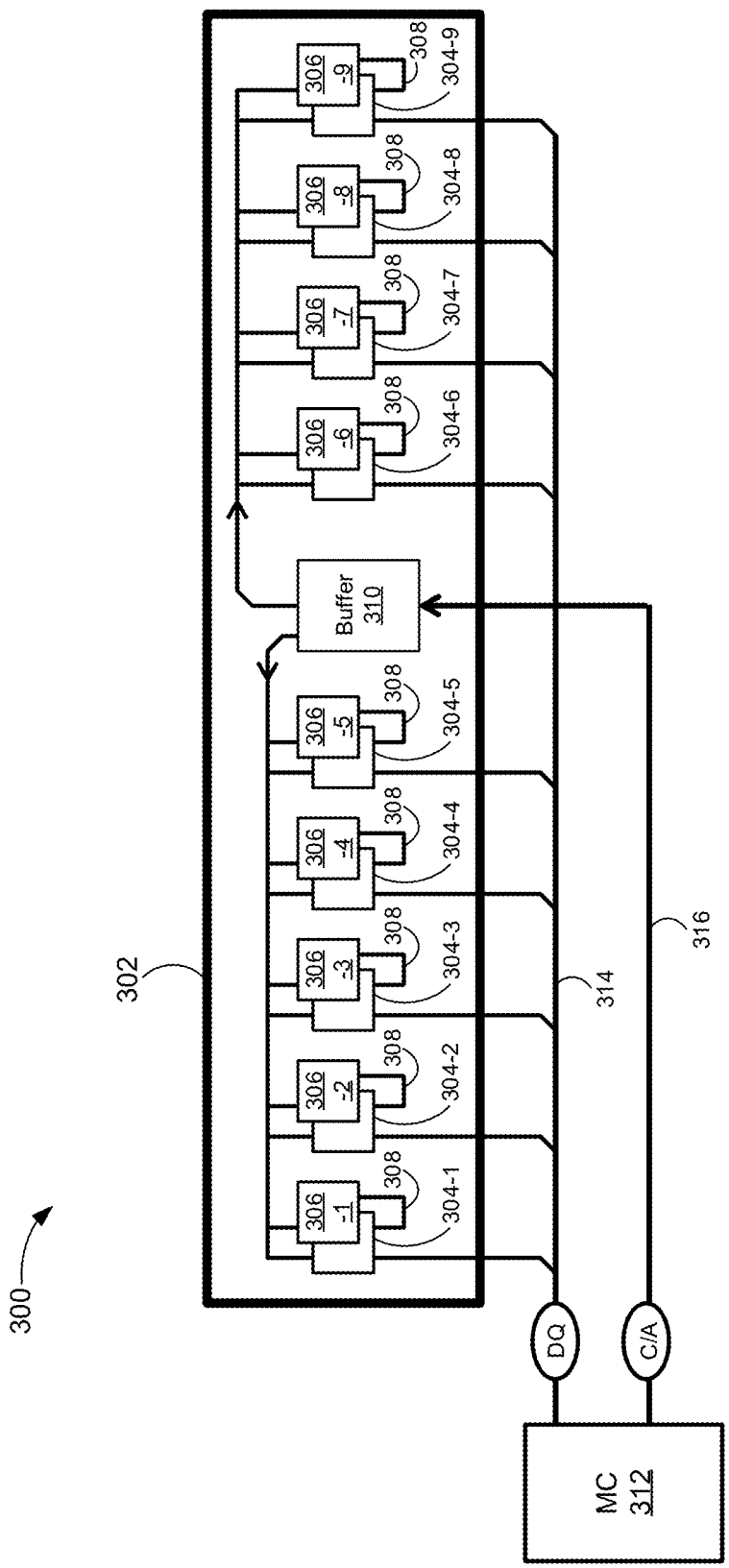
FIG. 3 is a block diagram of a system in which semiconductor packages containing semiconductor memory die are mounted on a module in accordance with some embodiments.

FIG. 3 is a block diagram of a system 300 in which semiconductor packages containing semiconductor memory die are mounted on a module (e.g., a DIMM) 302 in accordance with some embodiments. A first plurality of semiconductor packages (or POP configurations) 304-1 through 304-9 is mounted on a first side (e.g., the bottom side) of the module 302 and a second plurality of semiconductor packages (or POP configurations) 306-1 through 306-9 is mounted on a second side (e.g., the top side) of the module 302. In some embodiments, each pair of packages 304-M and 306-M (where 1≤M≤9) are mounted opposite to each other on opposing sides of the module 302. While FIG. 3 shows an example in which each side of the module 302 includes nine packages, in general the number of packages mounted on the module 302 may vary.

In some embodiments, each package (or POP configuration) 304-M includes a master memory die 102a (FIG. 1) and each package (or POP configuration) 306-M includes one or more slave memory die 102b (FIG. 1). For example, each package 304-M and 306-M includes multiple memory die (e.g., multiple stacked memory die): each package 304-M includes a master memory die 102a and one or more slave memory die 102b, while each package 306-M includes multiple slave memory die 102b. In one example, each package 304-M is an example of a package 232a (FIG. 2D) and each package 306-M is an example of a package 232b (FIG. 2D). Each pair of packages 304-M and 306-M (e.g., pair 304-1 and 306-1, pair 304-2 and 306-2, etc.) thus may be an example of the system 230 (FIG. 2D). In other examples, each package 304-M and 306-M includes a single memory die. For example, each package 304-M is an example of a package 242a (FIG. 2F) and each package 306-M is an example of a package 242b (FIG. 2F). Each pair of packages 304-M and 306-M (e.g., pair 304-1 and 306-1, pair 304-2 and 306-2, etc.) thus may be an example of the system 240 (FIG. 2F).

A memory controller (MC) 312 is coupled to the module 302. For example, the memory controller 312 may be mounted on a circuit board to which the module 302 is connected. A data bus 314 connects the memory controller 304 to the master memory die 102a (FIG. 1) in the first plurality of semiconductor packages 304-1 through 304-9. In some embodiments, the data bus 314 includes a plurality of data signal lines (e.g., lines 116, FIG. 1), each of which is coupled to a respective primary data interface 104a (FIG. 1) in one of the packages 304-1 through 304-9. The data bus 314 also may include data strobe signal lines. The data bus may include multiple groups of signal lines, with each group coupling the memory controller 114 to a respective one of the packages 304-1 through 304-9. In one example, each group of signal lines includes four data signal lines and two data strobe signal lines, with each of the four data signal lines being connected to a respective primary data interface 104a (FIG. 1).

Data signal lines 308 (e.g., signal lines 118, FIG. 1) couple the secondary data interfaces 106a (FIG. 1) of the master memory die 102a (FIG. 1) of the packages 304-1 through 304-9 to secondary data interfaces 106b of the slave memory die 102b (FIG. 1) in the packages 306-1 through 306-9. Each package 304-M thus buffers data for a corresponding package 306-M. In some embodiments, the signal lines 308 are SDR data lines, while the data bus 314 is a DDR data bus. (If the packages 304-1 through 304-9 include one or more slave die 102b, the secondary data interfaces 106b of those slave die 102b are coupled within each package to the secondary data interface 106a of the corresponding master die 102a.)

The memory controller 312 sends C/A signals to the packages 304-1 through 304-9 and 306-1 through 306-N via a plurality of C/A signal lines 316, which may be buffered by an optional buffer 310 on the module 302. In some embodiments, each memory die in a respective pair of packages 304-M and 306-M receives its own CS (i.e., chip select) signal, and corresponding memory die in different pairs of packages 304-M and 306-M receive the same CS signal. Commands (e.g., memory access commands) issued by the memory controller 312 are therefore performed in parallel by one memory die in each pair of packages 304-M and 306-M.

In the example of the system 300, the signal lines 308 couple packages 304-M and 306-M situated on opposite sides of the module 302. In other systems, signal lines (e.g., lines 118, FIG. 1) may couple packages on the same side of a module (e.g., such that respective pairs of packages on the same side of the module are examples of the system 236, FIG. 2E, or 250, FIG. 2G). In still other systems, each package or POP configuration on the module includes a master memory die 102a as well as one or more slave memory die 102b (FIG. 1), and the signal lines 308 are absent (e.g., such that each POP configuration is an example of a system 200, 214, or 220, FIGS. 2A-2C).

Figure 4A:
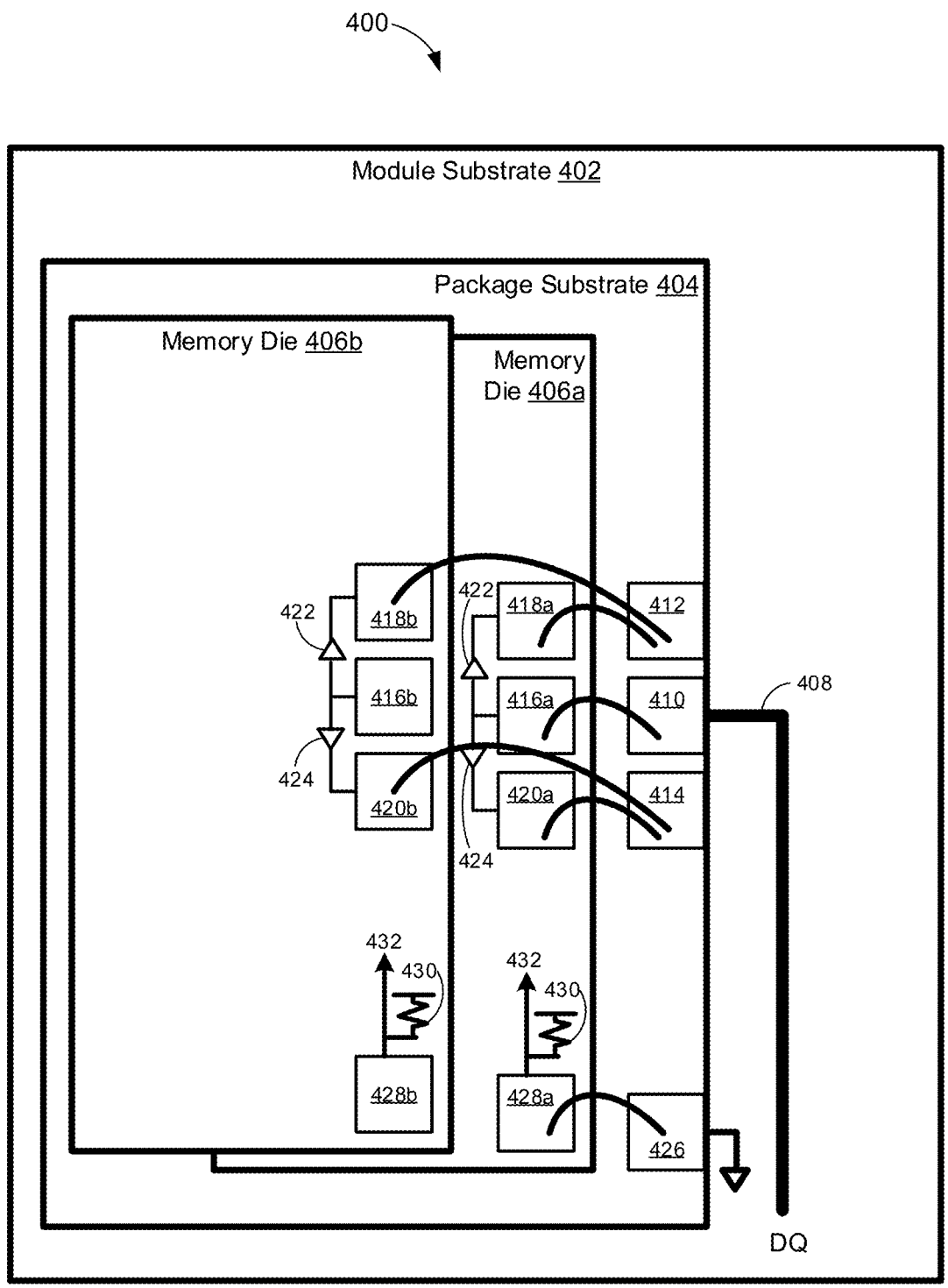
FIG. 4A is a schematic diagram of a system in which two memory die are stacked on a package substrate that is mounted on a module substrate in accordance with some embodiments.

FIG. 4A is a schematic diagram of a system 400 in which two memory die 406a and 406b are stacked on a package substrate 404 that is mounted on a module substrate 402 in accordance with some embodiments. The first memory die 406a is configured as a master memory die 102a (FIG. 1), while the second memory die 406b is configured as a slave memory die 102b (FIG. 1). The package substrate 404 and die 406a and 406b compose a semiconductor package that is an example of a package 202a (FIG. 2A), 232a (FIG. 2D), or 232c (FIG. 2E), while the module substrate 402 is an example of the module substrate 204 (FIG. 2A, 2D, or 2E).

The master memory die 406a includes a primary data interface 104a (FIG. 1), which includes a bond pad 416a and buffers 422 and 424, and a secondary data interface 106a (FIG. 1), which includes bond pads 418a and 420a. The slave memory die 406b includes a primary data interface 104b (FIG. 1), which includes a bond pad 416b and buffers 422 and 424, and a secondary data interface 106b (FIG. 1), which includes bond pads 418b and 420b. A primary bond pad 410 on the package substrate 402 is coupled to a data signal line 408 (e.g., signal line 116, FIG. 1) on the module substrate 402. The bond pad 416a on the master memory die 406a is wire-bonded to the primary bond pad 410 and thus coupled to the data signal line 408. The bond pad 416b on the slave memory die 406b is not bonded out, since the primary interface 104b (FIG. 1) of the slave memory die 406b is disabled. The bond pads 418a and 418b are each wire-bonded to a secondary bond pad 412 on the package substrate 404 and thus are coupled to each other. The bond pads 420a and 420b are similarly each wire-bonded to another secondary bond pad 414 on the package substrate 404 and thus coupled to each other. The secondary bond pads 412 and 414 thereby couple the secondary data interfaces 106a and 106b (FIG. 1) of the master memory die 406a and slave memory die 406b.

During write operations, the data signal line 408 provides an input data stream (e.g., DDR data) to the bond pad 416a through the bond pad 410. The buffers 422 and 424 in the master memory die 406a are clocked such that they deserialize the input data stream into first and second data streams (e.g., SDR data streams). The first data stream is provided from the buffer 422, through the bond pads 418a and 412, to the bond pad 418b of the slave memory die 406b. The second data stream is provided from the buffer 424, through the bond pads 420a and 414, to the bond pad 420b of the slave memory die 406b. The master memory die 406a thus buffers data for the slave memory die 406b. In some embodiments, the buffers 422 and 424 in the master memory die 406a only forward data during write operations directed at the slave memory die 406b; during write operations directed at the master memory die 406a they are deactivated. The buffers 422 and 424 in the slave memory die 406b are always deactivated in accordance with some embodiments.

The master and slave memory die 406a and 406b include respective mode configuration bond pads 428a and 428b that are part of respective mode configuration interfaces 112a and 112b (FIG. 1). Each mode configuration bond pad 428a and 428b is coupled to a power supply through an on-die resistor 430. In the system 400, the bond pad 428a is wire-bonded to a pad 426 on the package substrate 404 that is connected to ground, thus putting a signal 432 in a logic-low state and instructing the memory die 406a to configure itself as a master die. The bond pad 428b is not bonded out and is thus pulled high by the resistor 430, putting the signal 432 in a logic-high state that instructs the memory die 406b to configure itself as a slave die. (Alternatively, grounding a bond pad 428a or 428b may configure the corresponding memory die as a slave die, and not grounding the bond pad 428a or 428b may configure the die as a master die.)

Figure 4B:
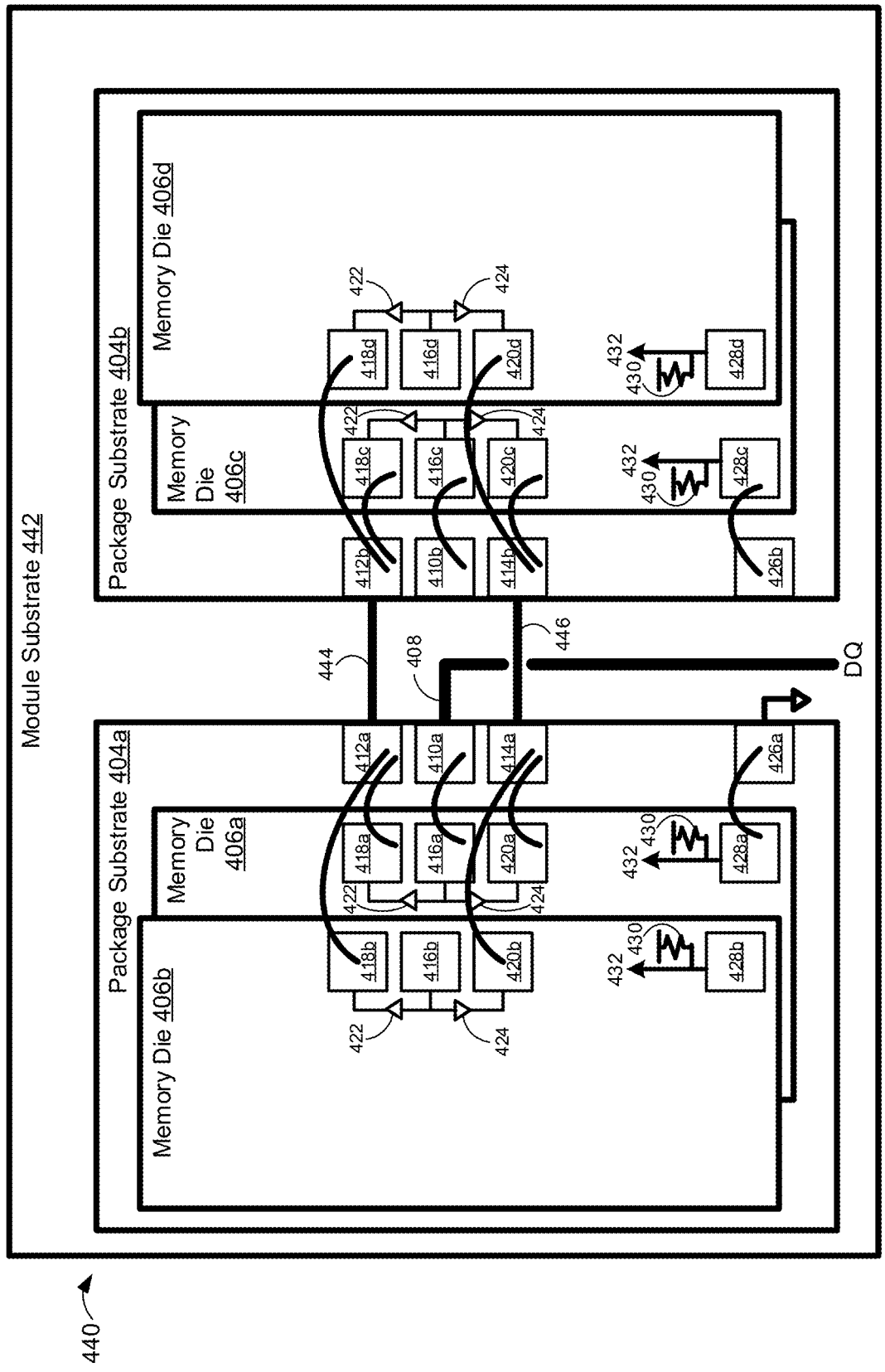
FIG. 4B is a schematic diagram of a system in which a master memory die is stacked with a slave memory die on a package substrate and coupled to slave memory die stacked on another package substrate in accordance with some embodiments.

FIG. 4B is a schematic diagram of a system 440 in which a master memory die 406a is stacked with a slave memory die 406b on a package substrate 404a and is also coupled to slave memory die 406c and 406d stacked on another package substrate 404b, in accordance with some embodiments. The master memory die 406a is an example of a master die 102a (FIG. 1), while the slave memory die 406b-d are examples of slave die 102b (FIG. 1). The packages substrates 404a and 404b are each an example of the package substrate 404 (FIG. 4A) and are mounted on a module substrate 442.

The memory die 406a and 406b are wire-bonded to the package substrate 404a as described for FIG. 4A. The memory die 406c and 406d are wire-bonded to the package substrate 404b such that they are both configured as slaves: although the mode configuration bond pad 428c is wire-bonded to the bond pad 426b, the bond pad 426b is not connected to ground. Also, the bond pad 416c in the primary data interface 102b (FIG. 1) of the die 406c is bonded to the primary bond pad 410b of the package substrate 404b, but the primary bond pad 410b is not connected to the data signal line 408. The packages corresponding to the package substrates 404a and 404b are thus interchangeable: the die 406a and 406c may each serve as master or slave, depending on where the package substrates 404a and 404b are mounted on the module substrate 442. This interchangeability simplifies manufacturing.

During write operations, the buffers 422 and 424 in the master memory die 406a deserialize the data received at the bond pad 416a from the signal line 408 and primary bond pad 410a, as described with respect to FIG. 4A. The buffer 422 provides a first data stream to the bond pad 418a, from where it is transmitted through the bond pads 412a and 418b to the die 406b, and through the bond pad 412a, signal line 444, and bond pads 412b, 418c, and 418d to the die 406c and 406d. The buffer 424 provides a second data stream to the bond pad 420a, from where it is transmitted through the bond pads 414a and 420b to the die 406b, and through the bond pad 414a, signal line 446, and bond pads 414b, 420c, and 420d to the die 406c and 406d. The signal lines 444 and 446 thus couple the secondary data interfaces 106a and 106b (FIG. 1) of the die 406a-d and are examples of the signal lines 118 (FIG. 1).

Figure 5A:
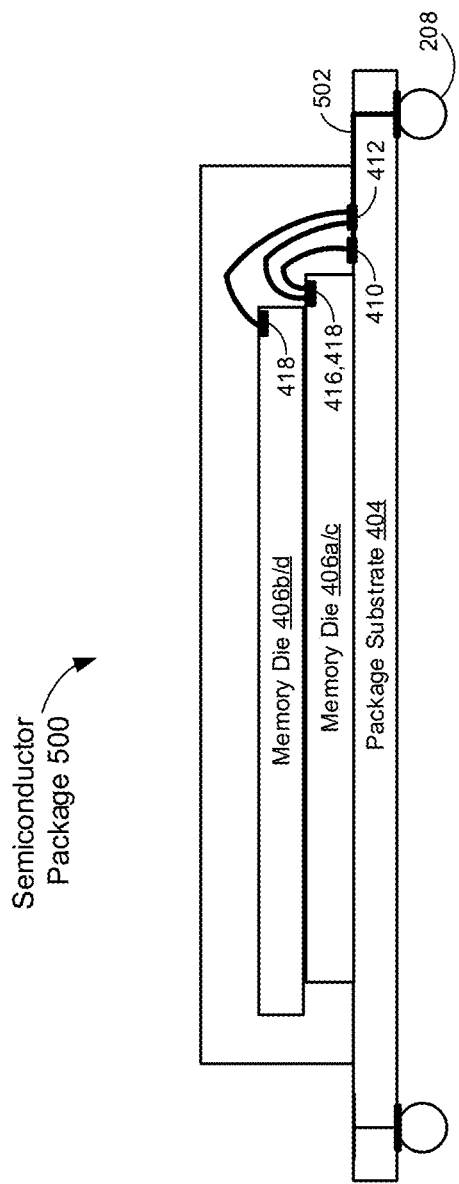
FIG. 5A is a cross-sectional view illustrating wire-bonding in a semiconductor package with stacked memory die in accordance with some embodiments.

FIG. 5A is a cross-sectional view illustrating wire-bonding in a semiconductor package 500 in accordance with some embodiments. The package 500 is an example of a package in the system 400 (FIG. 4A) or 440 (FIG. 4B). Two memory die 406 (e.g., 406a and 406b, or 406c and 406d, FIG. 4B) are stacked on a package substrate 404. A bond pad 416 (e.g., 416a or 416c, FIG. 4b) on the die 406a/c is wire-bonded to a primary bond pad 410 on the package substrate 404, while bond pads 418 (e.g., 418a-b or 418c-d, FIG. 4B) on the die 406a/c and 406b/d are wire-bonded to a secondary bond pad 412 on the package substrate 404. A signal line 502 in the package substrate 404 couples the bond pad 412 to a pin 208. In some embodiments, the pin 208 connects to the signal line 444 (FIG. 4B) when the package 500 is mounted on a module substrate 442 (FIG. 4B). Another signal line (not shown) may couple the bond pad 410 to another pin.

Figure 5B:
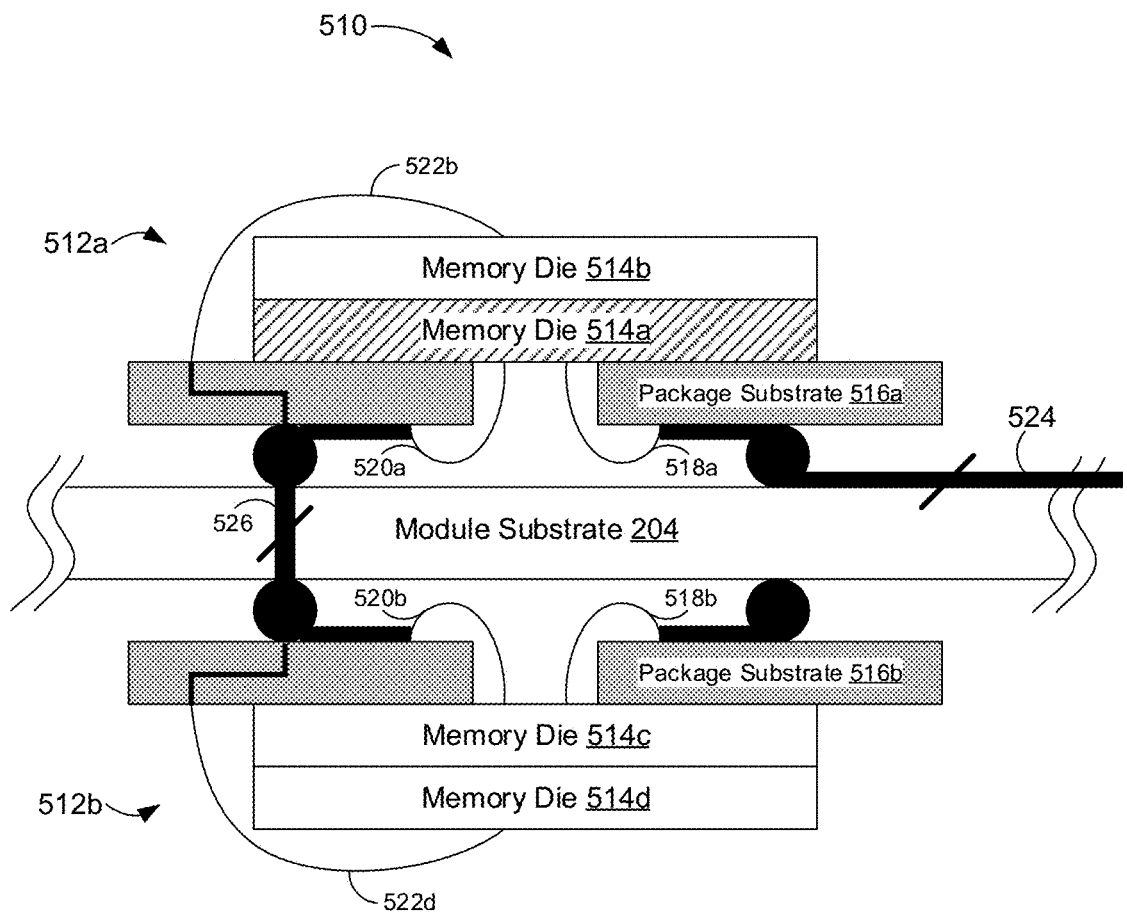
FIGS. 5B and 5C are cross-sectional views illustrating wire-bonding in semiconductor memory systems in accordance with some embodiments.

FIG. 5B is a cross-sectional view illustrating wire-bonding in a semiconductor memory system 510 in accordance with some embodiments. The system 510 is an example of the system 230 (FIG. 2D). Semiconductor packages 512a and 512b are mounted in a clam-shell configuration on a module substrate 204. Each package 512a and 512b includes two memory die 514a and 514b, or 514c and 514d, stacked on a package substrate 516a or 516b. The memory die 514a is configured as a master memory die 102a (FIG. 1), while the memory die 514b-d are configured as slave memory die 102b (FIG. 1).

Each package substrate 516a and 516b includes a central aperture to allow bond wires to be connected to the bottom die 514a and 514c. A bond wire 518a couples a data signal line 524 (e.g., signal line 116, FIG. 1) to a primary data interface 104a (FIG. 1) on the memory die 514a. A bond wire 518b connects to a primary data interface 104b (FIG. 1) on the memory die 514c but is not coupled to a signal line in the module substrate 204. A plurality of data signal lines 526 (e.g., signal lines 118, FIG. 1) couple together secondary data interfaces 106a and 106b (FIG. 1) on each die 514a-d. Bond wires 520a and 520b respectively couple the die 514a and 514c to the signal lines 526, while bond wires 522b and 522d respectively couple the die 514b and 514d to the signal lines 526. Respective pins and signal lines in the packages 512a and 512b couple the signal lines 524 and 526 to respective bond wires.

Figure 5C:
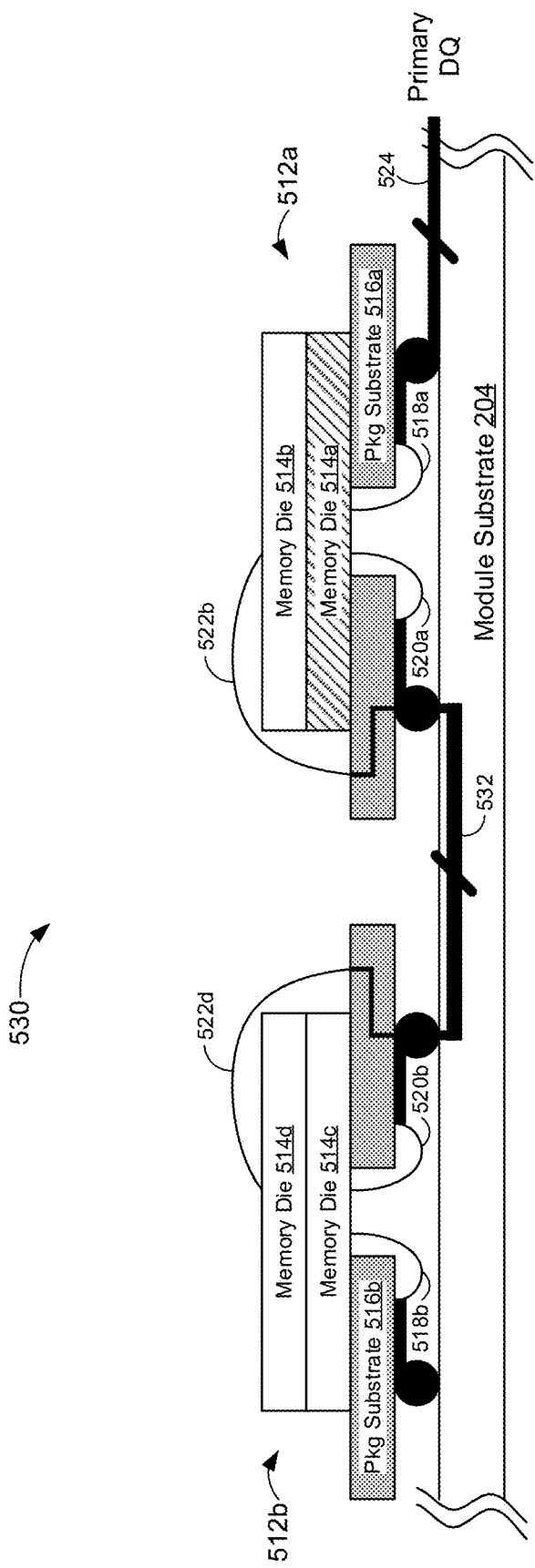

FIG. 5C is a cross-sectional view illustrating wire-bonding in another semiconductor memory system 530 in accordance with some embodiments. The system 530 is an example of the system 236 (FIG. 2E) and is identical to the system 510 (FIG. 5B) except that the semiconductor packages 512a and 512b are mounted on the same side of the module substrate 204. A plurality of data signal lines 532 (e.g., signal lines 118, FIG. 1) (e.g., signal lines 444 and 446, FIG. 4B) couple together secondary data interfaces 106a and 106b (FIG. 1) on each die 514a-d. Bond wires 520a and 520b respectively couple the die 514a and 514c to the signal lines 532, and bond wires 522b and 522d respectively couple the die 514b and 514d to the signal lines 532. Respective pins and signal lines in the packages 512a and 512b couple the signal lines 532 to respective bond wires.

Figure 5D:
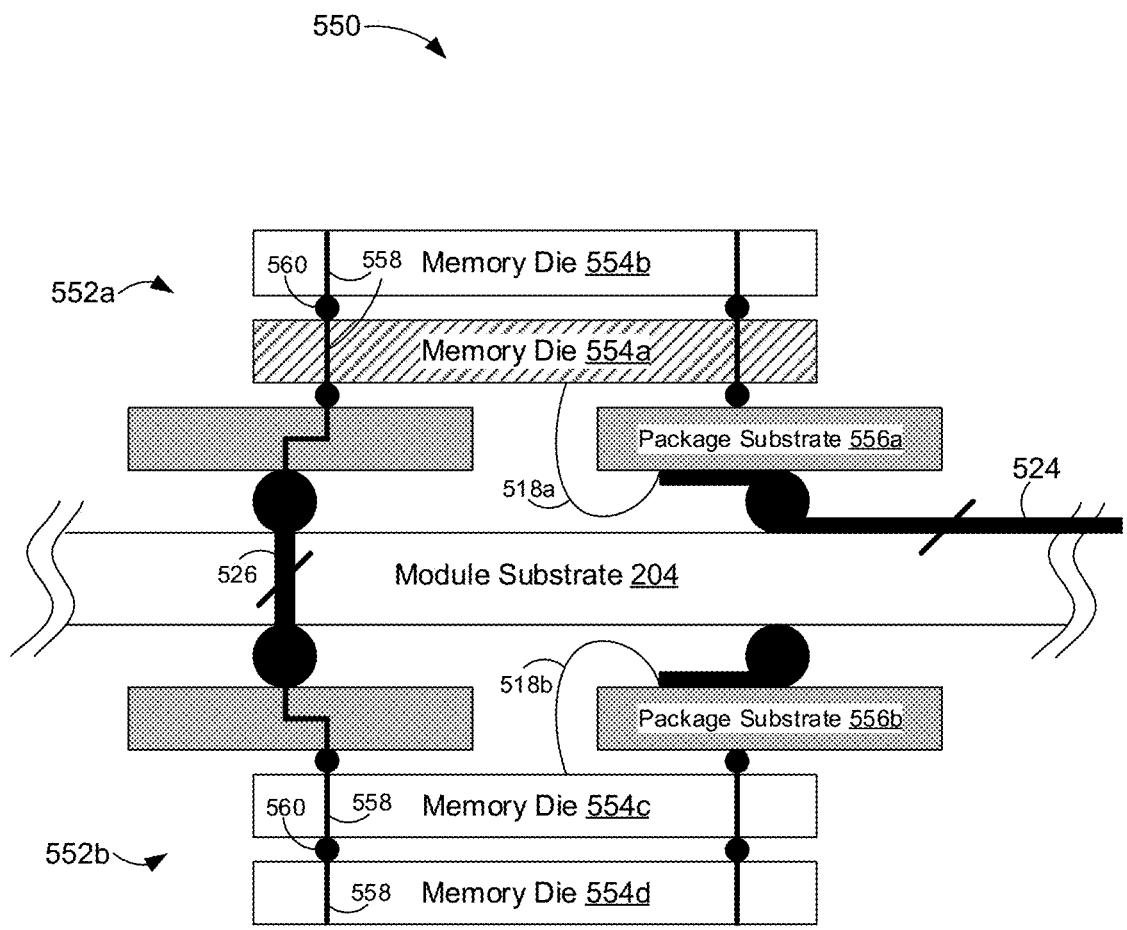
FIG. 5D is a cross-sectional view of a semiconductor memory system in which stacked memory die are coupled using through-die vias in accordance with some embodiments.

In some embodiments, instead of using bond wires, through-die vias (e.g., through-silicon vias or TSVs) are used to couple secondary data interfaces 106a and/or 106b (FIG. 1) on different memory die 102a and/or 102b (FIG. 1). For example, FIG. 5D is a cross-sectional view of a system 550 in which packages 552a and 552b are mounted are mounted in a clam-shell configuration on a module substrate 204 in accordance with some embodiments. The system 550 is an example of the system 230 (FIG. 2D). Each package 552a and 552b includes two memory die 554a and 554b, or 554c and 554d, stacked on a package substrate 556a or 556b. The memory die 554a is configured as a master memory die 102*a* (FIG. 1), while the memory die 554*b-d* are configured as slave memory die 102*b* (FIG. 1). By analogy to the system 510 (FIG. 5B), a bond wire 518*a* couples a data signal line 524 (e.g., signal line 116, FIG. 1) to a primary data interface 104*a* (FIG. 1) of the master memory die 554*a*. The secondary data interfaces 106*a* and 106*b* (FIG. 1) of the memory die 554*a-d*, however, are coupled using through-die vias 558, along with interconnects 560, signal lines in the package substrates 556*a-b*, and the signal lines 526 (e.g., signal lines 118, FIG. 1). FIG. 5D is merely one example of a system in which through-die vias are used to couple secondary data interfaces 106*a* and/or 106*b* (FIG. 1). Other examples are possible. For example, through-die vias may be used in any of the systems of FIGS. 2A-2E.

Figure 6A:
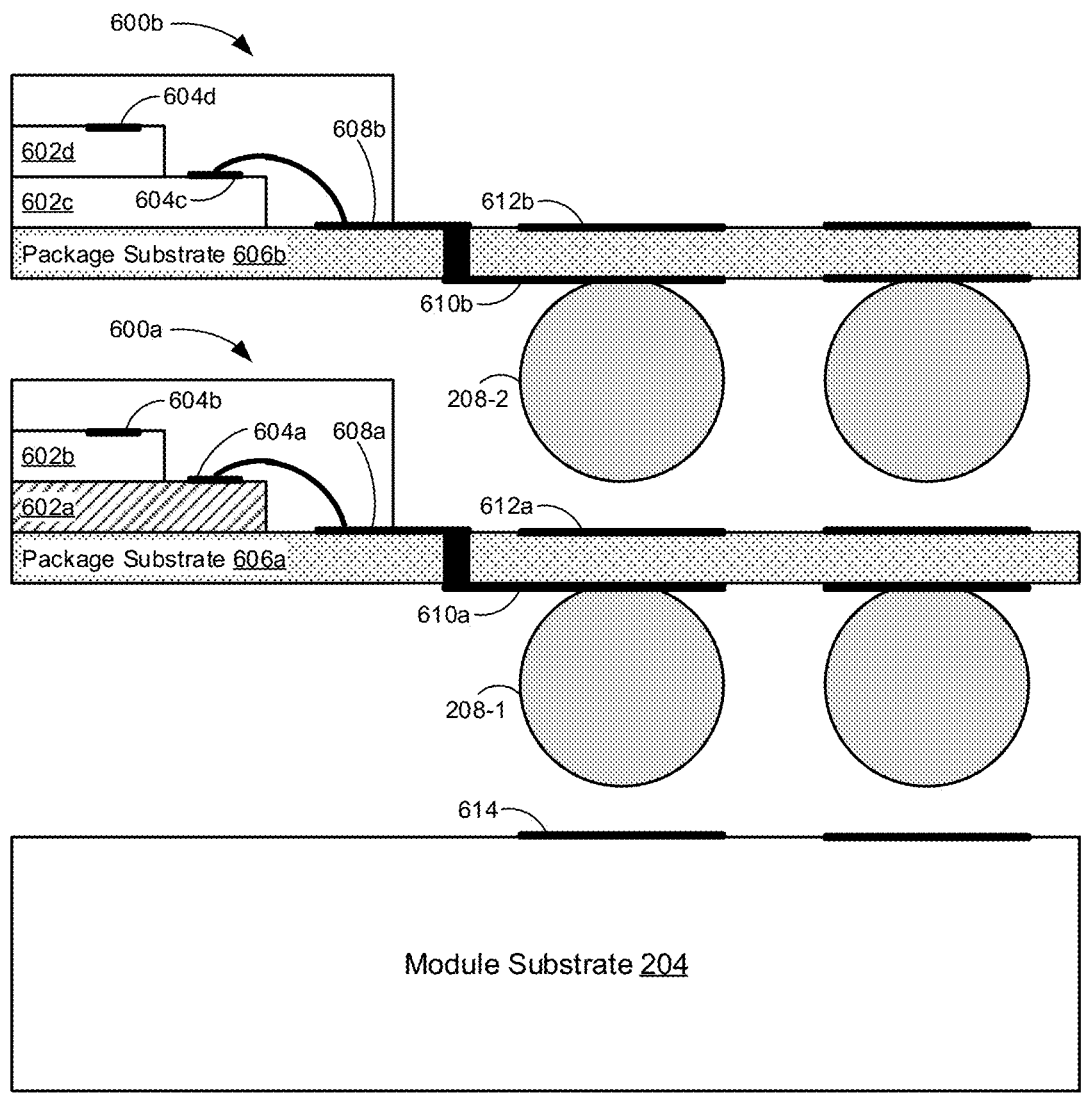
FIGS. 6A and 6B are cross-sectional exploded views of bond pads and pins associated with primary and secondary data interfaces in a POP configuration in accordance with some embodiments.

FIG. 6A is a cross-sectional exploded view of packages in a POP configuration (e.g., in systems 200 or 214, FIGS. 2A-2B), showing bond pads and pins associated with primary data interfaces 104*a* and 104*b* (FIG. 1) in accordance with some embodiments. Semiconductor packages 600*a* and 600*b* are stacked in a POP configuration. The package 600*a* includes memory die 602*a* and 602*b* stacked on a package substrate 606*a*. The package 600*b* includes memory die 602*c* and 602*d* stacked on a package substrate 606*b*. The memory die 602*a* is configured as a master memory die 102*a* (FIG. 1), while the memory die 602*b-d* are configured as slave memory die 102*b* (FIG. 1). A bond pad 604*a* on the memory die 602*a* is part of a primary data interface 104*a* (FIG. 1). Bond pads 604*b-d* on the memory die 602*b-d* are parts of respective (disabled) primary data interfaces 104*b* (FIG. 1).

The bond pad 604*a* on the memory die 602*a* is wire-bonded to a bond pad 608*a* on the package substrate 606*a*, which is coupled to a conductive pad 610*a* on the bottom surface of the package substrate 606*a*. The conductive pad 610*a* is connected to a pin 208-1 that connects to a conductive pad 614 on the module substrate 204. The conductive pad 614 may be connected to a data signal line (not shown), such as the signal line 116 (FIG. 1), thus coupling the bond pad 604*a* to the data signal line. The bond pad 604*b* on the memory die 602*b* is not bonded out. Because the memory die 602*b* is a slave, its primary data interface 104*b* (FIG. 1) and thus its bond pad 604*b* are not used. Similarly, the bond pad 604*d* on the memory die 602*d* is not bonded out and not used.

The bond pad 604*c* is bonded out in the same manner as the bond pad 604*a*: it is wire-bonded to a bond pad 608*b* on the package substrate 606*b*, which is coupled to a conductive pad 610*b* on the bottom surface of the package substrate 606*b*. The conductive pad 610*b* is connected to a pin 208-2 that connects to a conductive pad 612*a* on the top of the package substrate 606*a*. (A similar conductive pad 612*b* is situated on top of the package substrate 606*b*, allowing additional packages to be added to the POP stack). The conductive pad 612*b*, however, is not coupled to the module substrate 204. The bond pad 604*c* thus is not coupled to any signal lines in the module substrate 204, in accordance with the memory die 602*c*'s configuration as a slave.

Figure 6B:
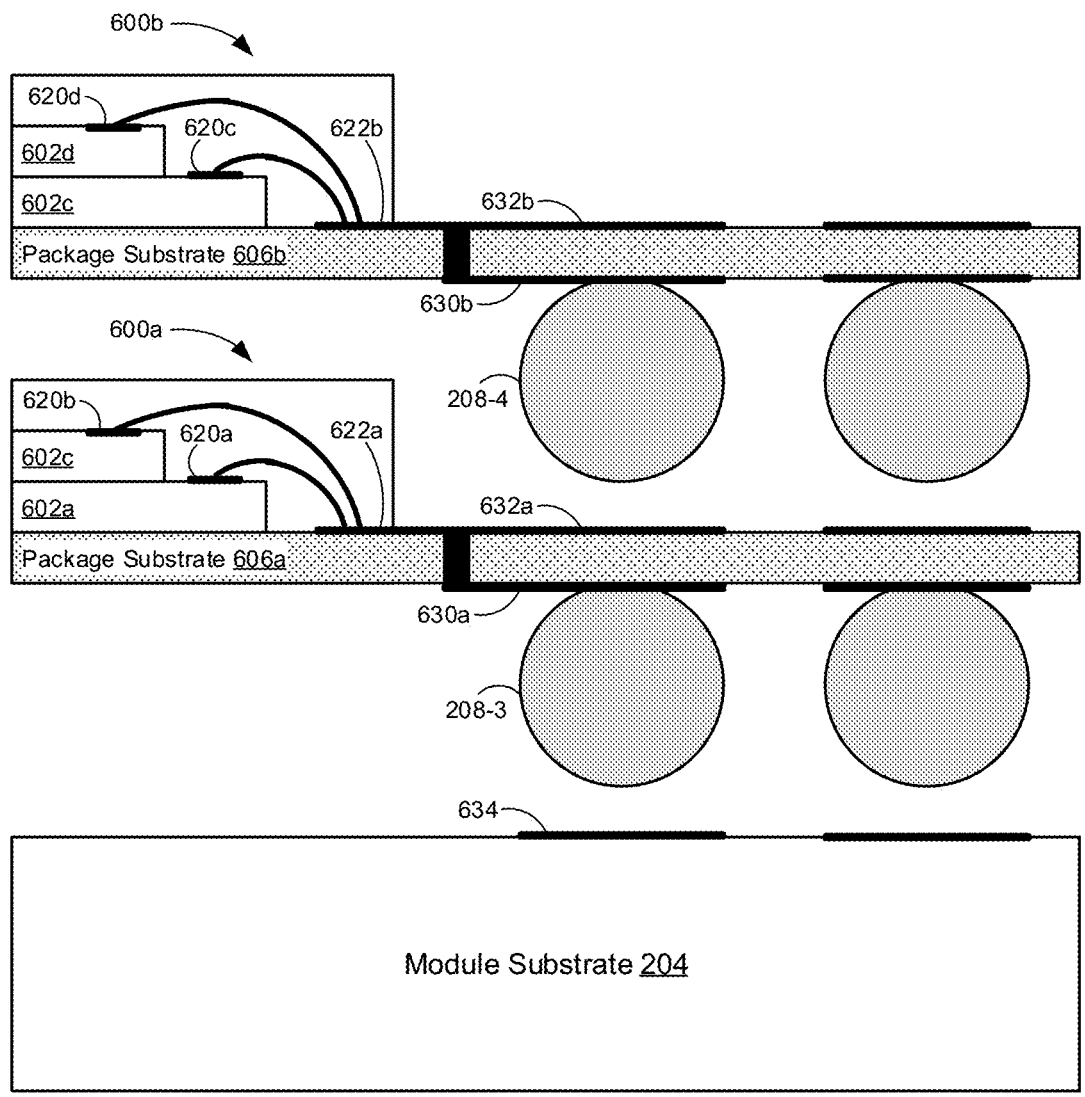

FIG. 6B is another cross-sectional exploded view of the packages 600*a* and 600*b*, showing bonds pads and pins associated with secondary data interfaces 106*a* and 106*b* (FIG. 1) in accordance with some embodiments. A bond pad 620*a* on the master memory die 602*a* is part of a secondary data interface 106*a* (FIG. 1). Bond pads 620*b-d* on the memory die 602*b-d* are parts of respective secondary data interfaces 106*b* (FIG. 1). The bond pads 620*a* and 620*b* in the package 600*a* are wire-bonded to a bond pad 622*a* on the package substrate 606*a*, which is coupled to a conductive pad 630*a* on the bottom of the package substrate 606*a* and a conductive pad 632*a* on the top of the package substrate 606*a*. Similarly, the bond pads 620*c* and 620*d* in the package 600*b* are wire-bonded to a bond pad 622*b* on the package substrate 606*b*, which is coupled to a conductive pad 630*b* on the bottom of the package substrate 606*b* and a conductive pad 632*b* on the top of the package substrate 606*b*. A pin 208-4 connects the conductive pad 630*b* to the conductive pad 632*a*. In this manner the bond pads 620*a-d*, and thus the secondary data interfaces 106*a* and 106*b* of the die 602*a-d*, are coupled together. Furthermore, a pin 208-3 connects the conductive pad 630*a* to a conductive pad 634 on the module substrate 204. The conductive pad 634 may be connected to a data signal line (not shown) that connects to secondary data interfaces 106*b* in other packages.

Because the packages 600*a* and 600*b* are structurally identical and their die 602*a* and 602*c* each configurable as either master or slave, the packages 600*a* and 600*b* may be stacked in any order in a POP configuration. This flexibility simplifies manufacturing.

Figure 7:
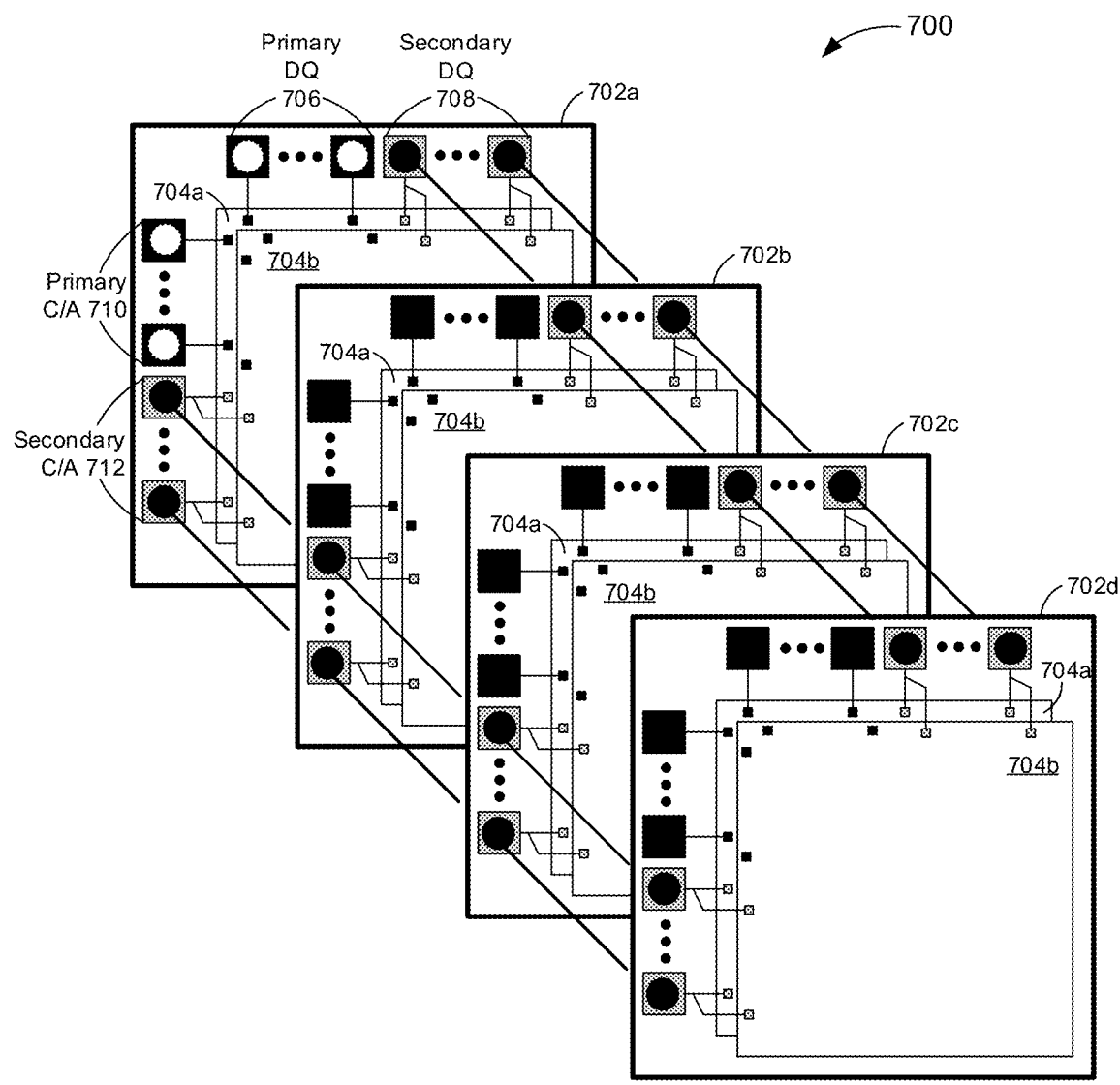
FIG. 7 is an exploded plan view of a POP configuration in accordance with some embodiments.

FIG. 7 is an exploded plan view of a POP configuration 700 in accordance with some embodiments. The POP configuration 700 includes four stacked package substrates 702*a-d*, with two memory die 704*a* and 704*b* mounted in a stack on each of the package substrates 702*a-d*. The POP configuration 700 is thus an example of a 4×2 POP configuration (e.g., in the system 200, FIG. 2A). The memory die 704*a* on the package substrate 702*a* is configured as a master memory die 102*a* (FIG. 1) and the other memory die 704*a* and 704*b* are configured as slave memory die 102*b* (FIG. 1).

Each of the package substrates 702*a-d* includes a plurality of primary data (DQ) conductive pads 706 (e.g., conductive pads 610*a* or 610*b*, FIG. 6A) and a plurality of secondary conductive data pads 708 (e.g., conductive pads 630*a*, 630*b*, 632*a*, and/or 632*b*, FIG. 6B). Respective primary data conductive pads 706 are coupled to respective primary data interfaces 104*a* (FIG. 1) on the memory die 704*a*. The primary data conductive pads 706 of the package substrate 702*a* are to be coupled to respective data signal lines 116 (FIG. 1) in an underlying circuit board substrate (e.g., module substrate 204, FIGS. 6A-6B). The primary data conductive pads 706 of the package substrates 702*b-d* are not to be coupled to external data signal lines, since the corresponding primary data interfaces 104*b* (FIG. 1) in the memory die 704*a* on the substrates 702*b-d* are not used. Respective secondary data conductive pads 708 on respective package substrates 702*a-d* are coupled to each other (as indicated by the straight lines in the exploded view of FIG. 7) and to respective secondary data interfaces 106*a* and 106*b* (FIG. 1) of the memory die 704*a* and 704*b*.

In some embodiments, the memory die 704*a* and 704*b* include primary and secondary C/A interfaces configured analogously to the primary and secondary data interfaces 104*a* and 104*b* (FIG. 1). Each of the package substrates 702*a-d* includes a plurality of primary C/A conductive pads 710 and a plurality of secondary C/A conductive pads 712. The primary C/A conductive pads 710 on each package substrate 702*a-d* are coupled to respective bond pads in a primary C/A interface of the memory die 704*a* on that package substrate. The secondary C/A conductive pads 712 on each package substrate 702*a-d* are coupled to respective bond pads in a secondary C/A interface of the memory die 704*a* and 704*b* on that package substrate. The primary C/A interface on each memory die 704*a* and 704*b* is coupled to the secondary C/A interface on the same memory die.

In operation, the primary C/A conductive pads 710 on the package substrate 702a receive C/A signals from C/A signal lines in an underlying circuit board (e.g., module) substrate and provide the C/A signals to the primary C/A interface of the memory die 704a on the package substrate 702a. This primary C/A interface forwards the C/A signals to the secondary C/A interface of the memory die 704a on the package substrate 702a. This secondary C/A interface forwards the C/A signals through the secondary C/A conductive pads 712 to the secondary C/A interfaces of the other memory die 704a and 704b in the configuration 700. The master memory die 704a on the package substrate 702a thus buffers C/A signals for the other memory die 704a and 704b. Latencies for the master memory die 704a may be adjusted accordingly.

Figure 8:
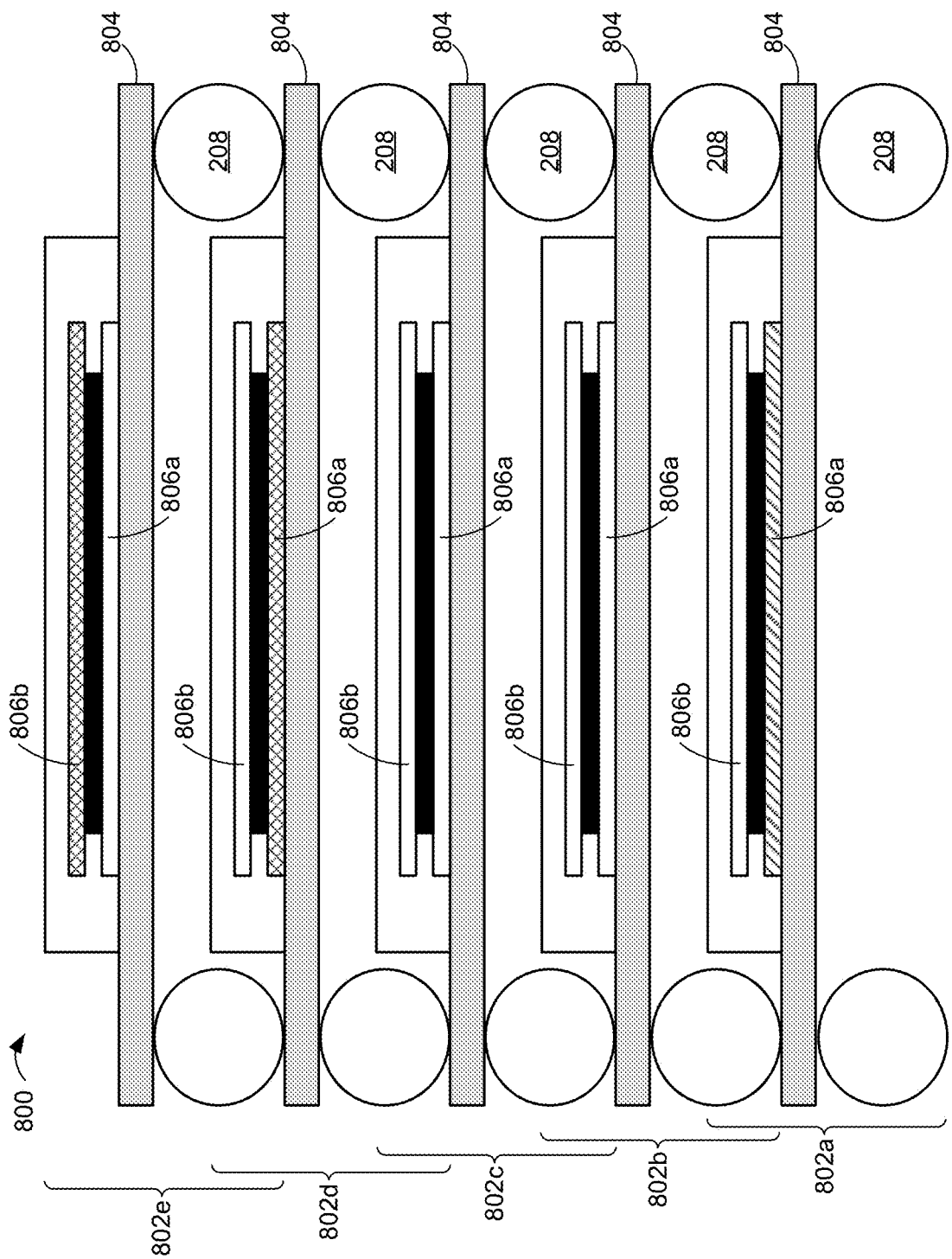
FIG. 8 is a cross-sectional view of a POP configuration that includes non-functional die in accordance with some embodiments.

In some embodiments, a system that includes multiple die in a package and/or in a POP configuration may include one or more non-functional die. The ability to use a multi-die package that includes a non-functional die increases yield and thus decreases manufacturing costs. FIG. 8 is a cross-sectional view of a POP configuration 800 that includes non-functional die in accordance with some embodiments. The POP configuration 800 includes a stack of five packages 802a-e, each of which includes two memory die 806a and 806b stacked on a package substrate 804. The memory die 806a in the package 802d and 806b in the package 802e are non-functional and thus not used to store data; instead, they are disabled. The memory die 806a in the package 802a is configured as a master memory die 102a (FIG. 1) and the other functional memory die 806a and 806b are configured as slave memory die 102b (FIG. 1). In some embodiments, the configuration 800 is implemented as illustrated for the configuration 700 (FIG. 7). Furthermore, the master memory die 806a may shift CS signals so that respective CS signals are provided to respective functional die 806a and 806b and not to the non-functional die 806a or 806b. A memory controller coupled to the configuration 800 thus does not need to know which die are functional and which are non-functional.

Figure 9A:
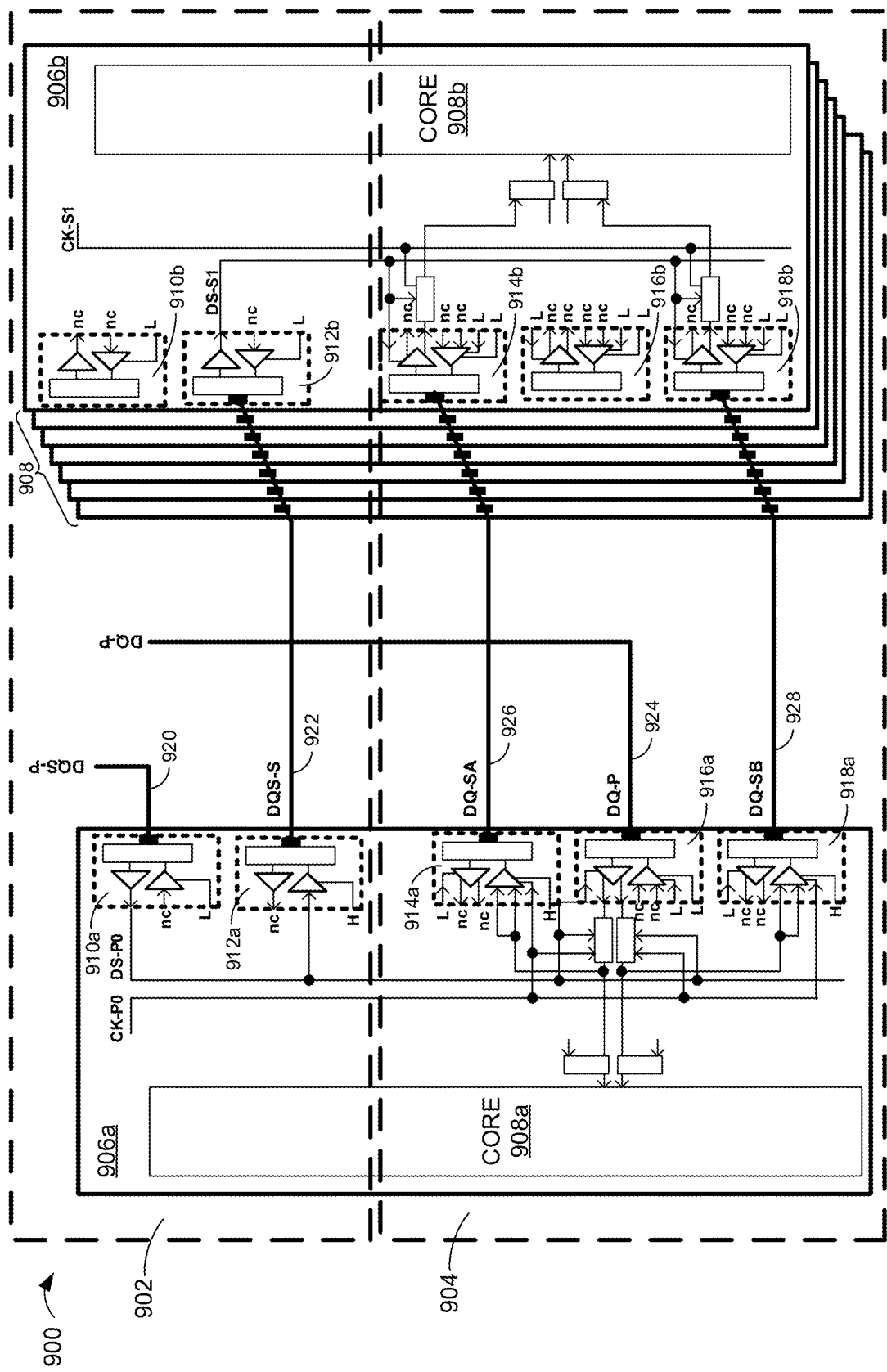
FIGS. 9A-9C are block diagrams showing write-path circuitry of a system in which a master memory die transmits a data strobe to slave memory die along with buffered data during write operations, in accordance with some embodiments.
Figure 9B:
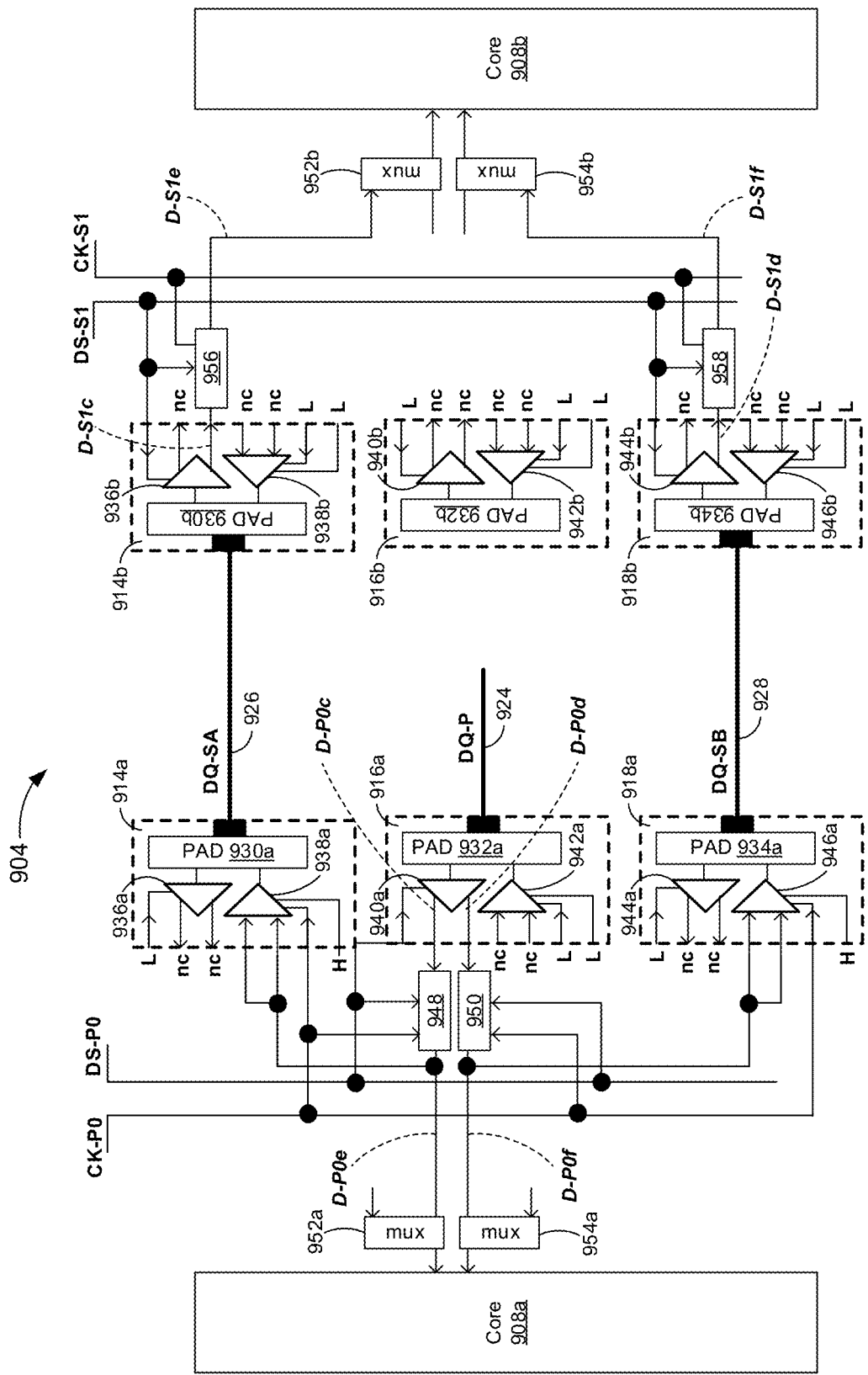
Figure 9C:
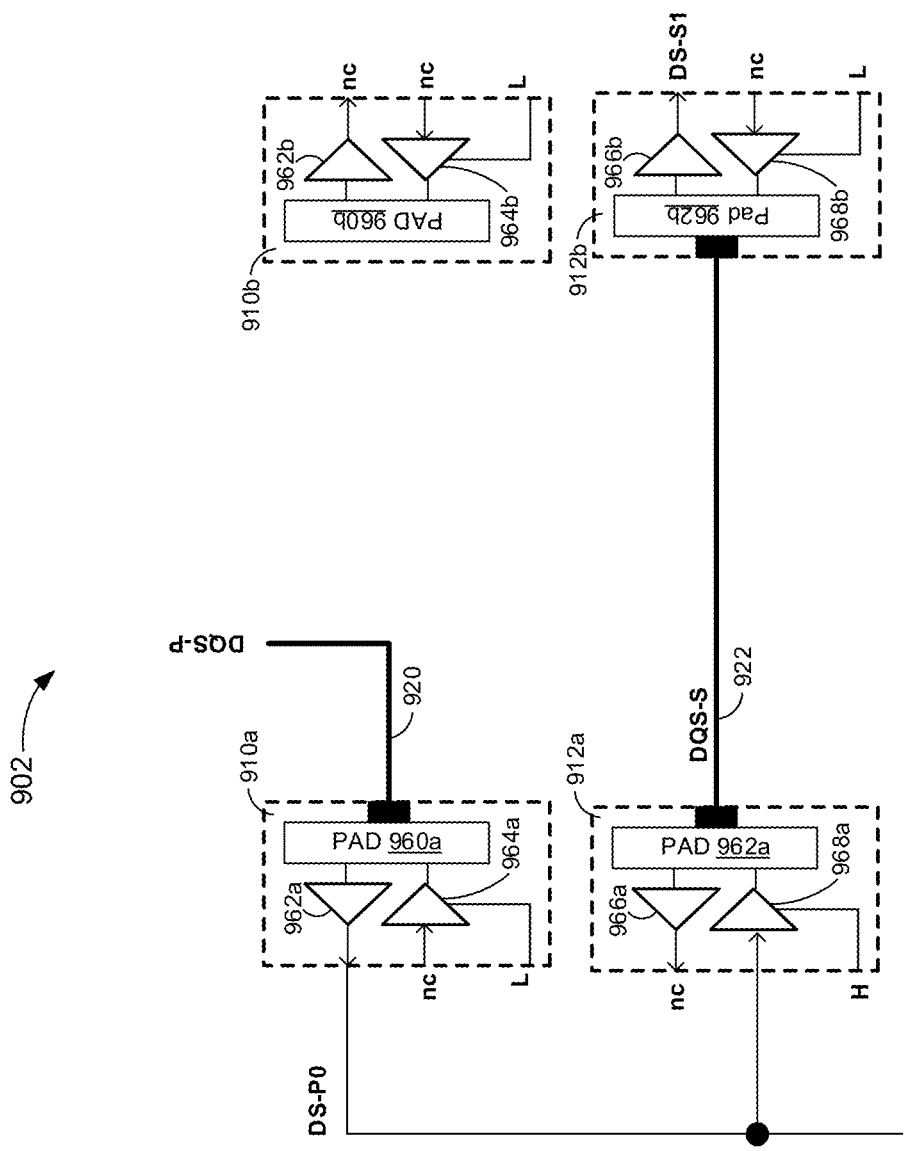
Figure 10:
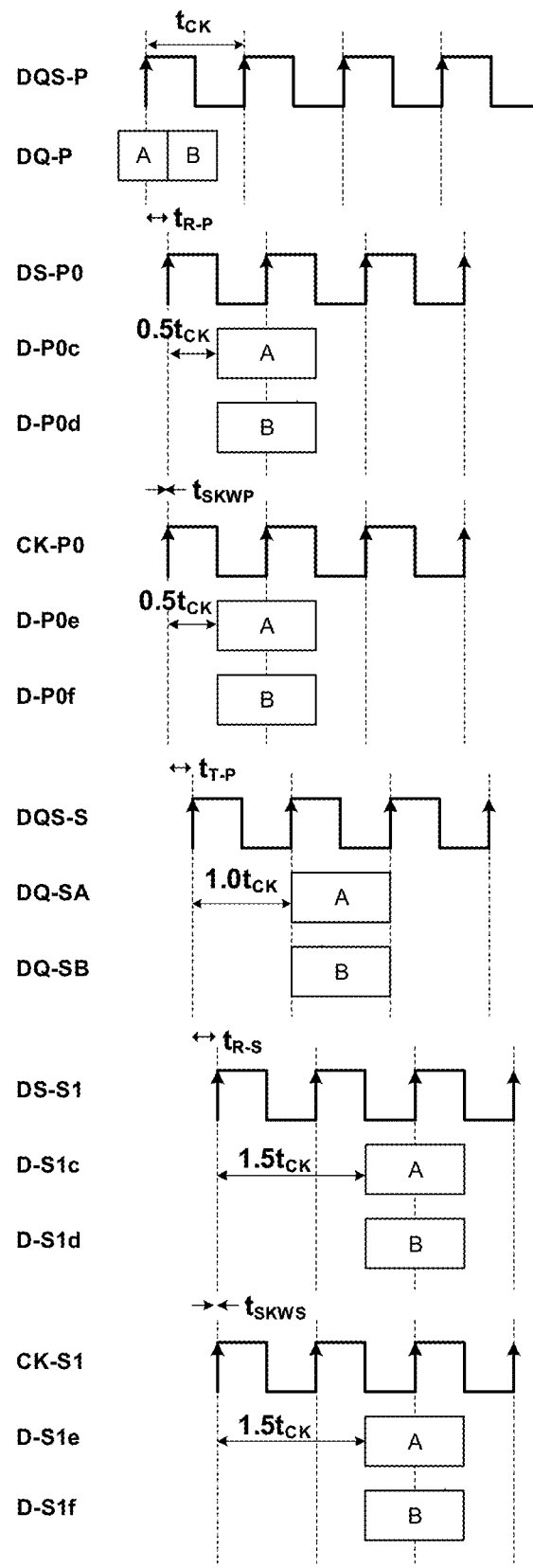
FIG. 10 shows timing diagrams for write operations in the system of FIGS. 9A-9C in accordance with some embodiments.

In some embodiments, a master memory die 102a (FIG. 1) transmits a data strobe (DQS) to slave memory die 102b (FIG. 1) along with buffered data during write operations, as illustrated in FIGS. 9A-9C in accordance with some embodiments. FIG. 9A is a block diagram of a system 900 in which a first memory die 906a is configured as a master memory die 102a and a plurality 908 of memory die 906b is configured as slave memory die 102b. The memory die 906a and 906b are structurally identical and each one is configurable as either a master or slave memory die. A portion 904 of each die 906a and 906b includes a primary data interface 916a/b and secondary data interface elements 914a/b and 918a/b. Secondary data interface elements 914a and 918a compose a secondary data interface 106a (FIG. 1), while secondary data interface elements 914b and 918b compose a secondary data interface 106b (FIG. 1). A portion 902 of each die 906a and 906b includes a primary data strobe interface 910a/b and a secondary data strobe interface 912a/b. The portion 904 is shown in an expanded view in FIG. 9B, while the portion 902 is shown in an expanded view in FIG. 9C. FIG. 10 shows timing diagrams for the system 900 during write operations in accordance with some embodiments.

Figure 11A:
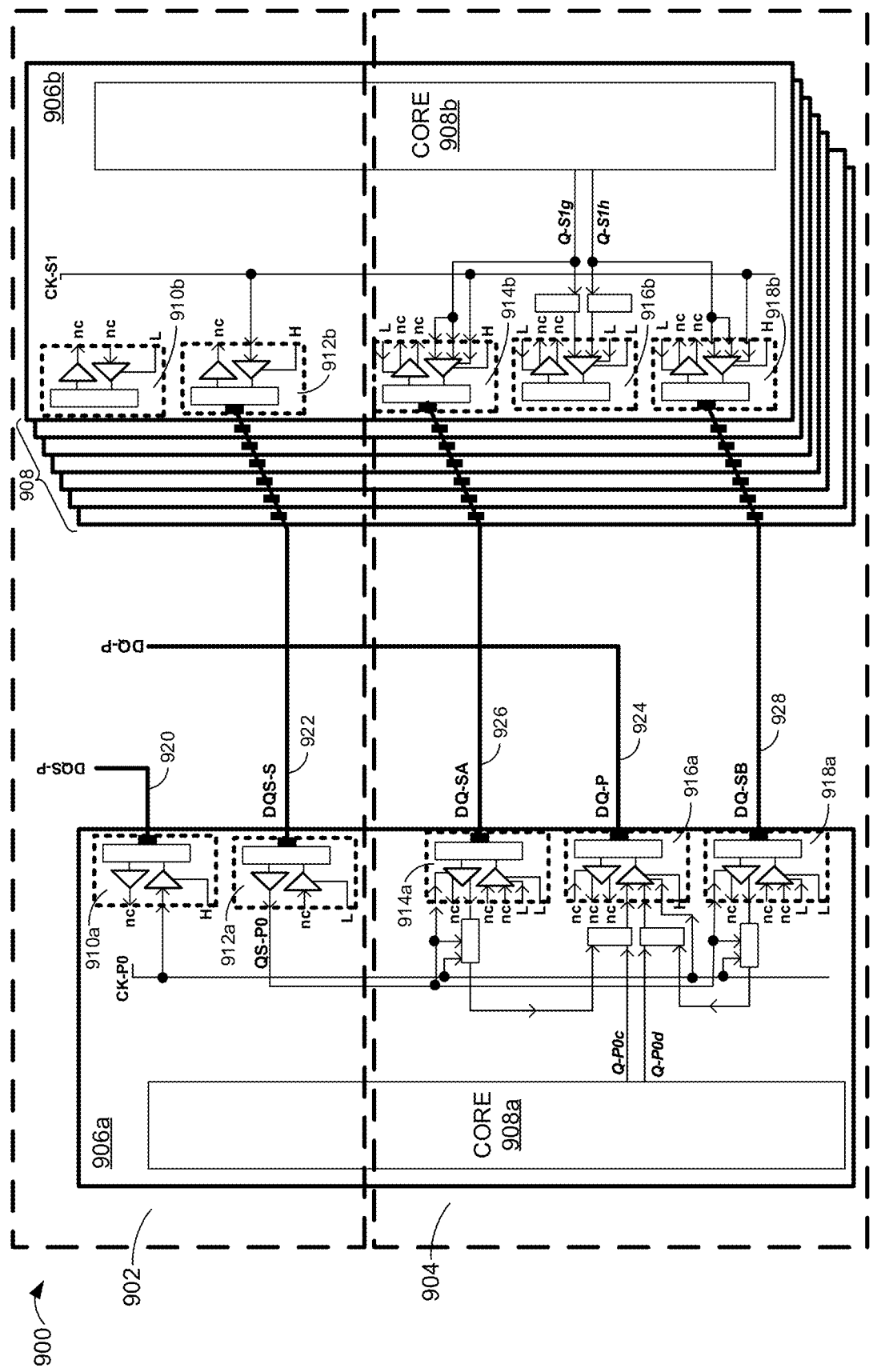
FIGS. 11A-11C are block diagrams showing read-path circuitry of a system in which a slave memory die transmits a data strobe to a master memory die along with data during read operations, in accordance with some embodiments.
Figure 11B:
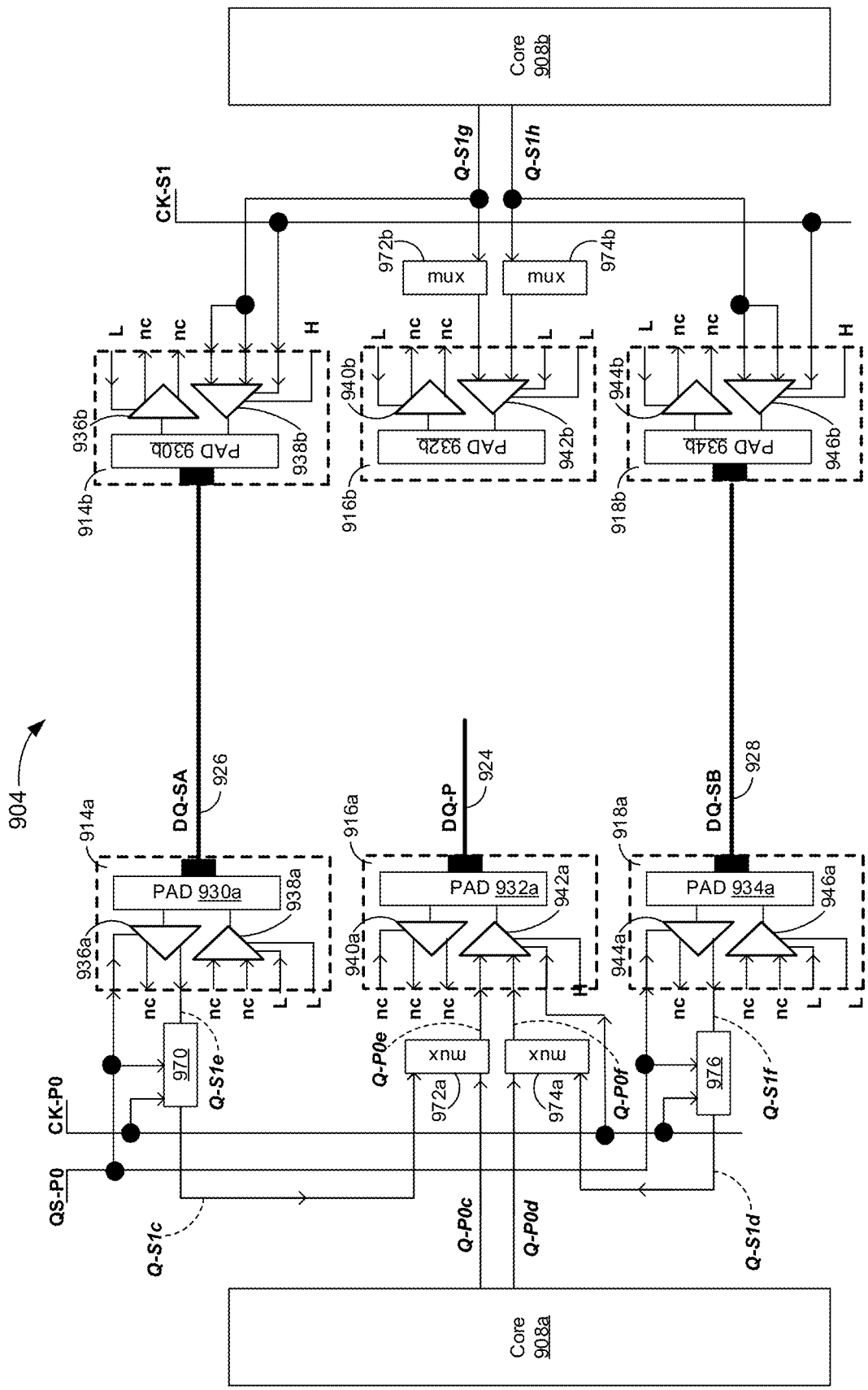
Figure 11C:
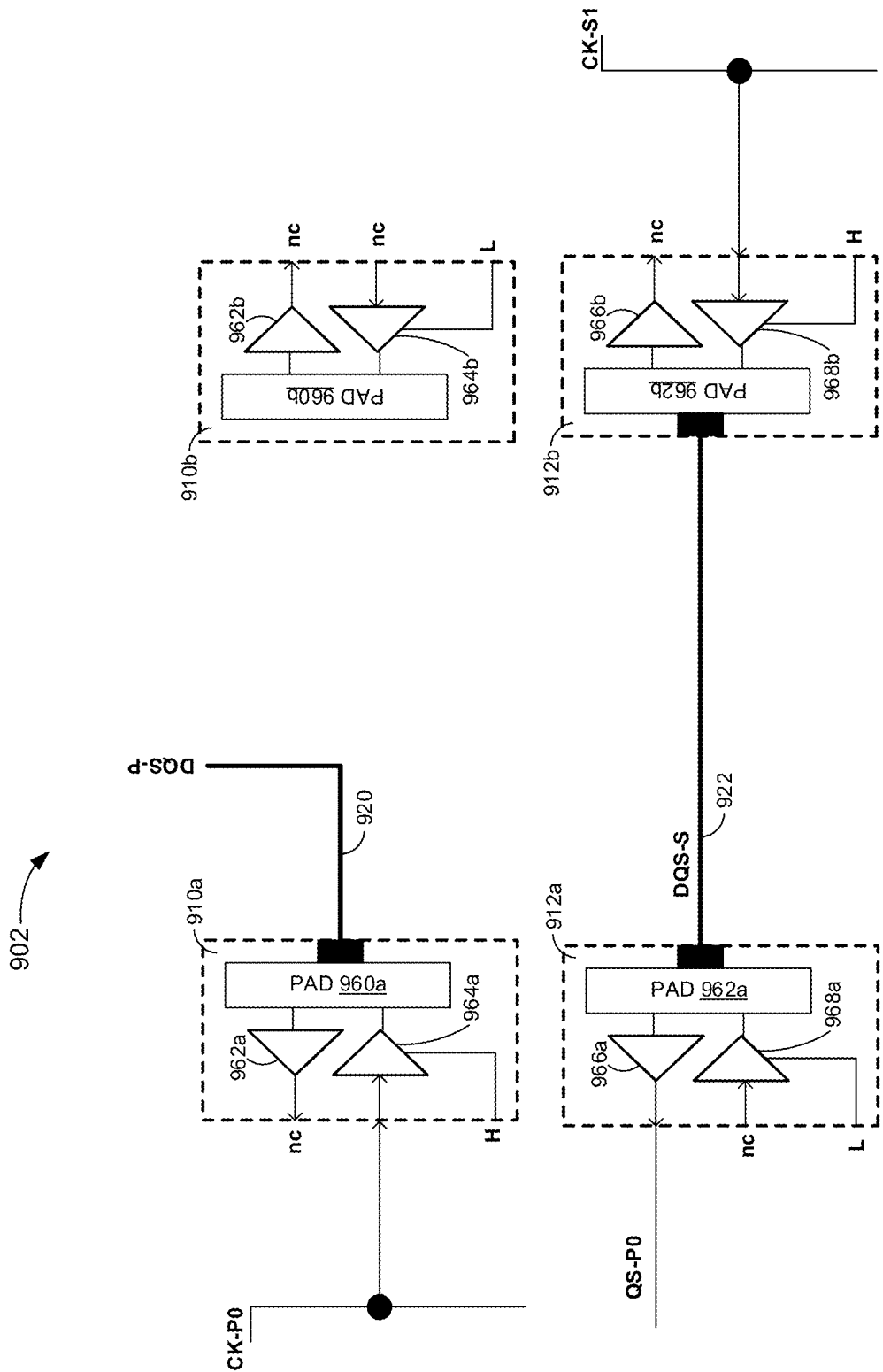

(FIGS. 9A-9C show write-path circuitry for the system 900. Read-path circuitry for the system 900 is shown in FIGS. 11A-11C, as described below. In these figures, a signal line labeled "H" is biased at a logic-high level, a signal line labeled "L" is biased at a logic-low level, and a signal line labeled "nc" is unused in the path being shown—for example, it is tristated.)

A signal line 924 (e.g., signal line 116, FIG. 1) provides a DDR data signal DQ-P to a bond pad 932a in the primary data interface 916a. A signal line 920 provides an associated data strobe DQS-P to a bond pad 960a in the primary strobe interface 910a. DQ-P and DQS-P are received, for example, from a memory controller 114 (FIG. 1). The signal DQ-P includes a data bit A (FIG. 10) that is valid for a rising edge of DQS-P and a data bit B (FIG. 10) that is valid for a falling edge of DQS-P. A buffer 960a in the primary strobe interface 910a delays DQS-P by an amount $t_{R-P}$, resulting in an internal strobe signal DS-P0 in the die 906a. DS-P0 clocks a buffer 940a in the primary data interface 916a, which deserializes DQ-P into two SDR data streams D-P0c (including bit A) and D-P0d (including bit B). The buffer 940a thus assigns bits of DQ-P to the data streams D-P0c and D-P0d in an alternating manner.

Skip circuits 948 and 950 transition the data streams D-P0c and D-P0d from a domain clocked by DS-P0 to a domain clocked by a clock signal CK-P0, resulting in data streams D-P0e and D-P0f. CK-P0 is offset from DS-P0 by a (potentially negligible) amount $t_{SKWP}$. If the write operation is directed at the master die 906a, multiplexers ("muxes") 952a and 954a provide the data streams D-P0e and D-P0f to the memory core 908a (e.g., core 108a, FIG. 1), where the data is stored. If the write operation is directed to a slave die 906b, however, then the data streams D-P0e and D-P0f are forwarded to the slave die 906b. The data stream D-P0e is provided to a buffer 938a in the secondary data interface element 914a, which drives a corresponding data stream DQ-SA onto a pad 930a. The data stream D-P0f is provided to a buffer 946a in the secondary data interface element 918a, which drives a corresponding data stream DQ-SB onto a pad 934a. Also, the internal strobe signal DS-P0 is provided to a buffer 968a in the secondary strobe interface 912a, which drives a corresponding strobe signal DQS-S onto a pad 962a. The buffer 968a introduces a delay $t_{T-P}$.

Data streams DQ-SA and DQ-SB are transmitted from the pads 930a and 934a, across signal lines 926 and 928 (e.g., signal lines 118, FIG. 1), to bond pads 930b and 934b in respective secondary data interface elements 914b and 918b. (The bond pad 932b is not bonded out, because the primary data interface 916b in the slave memory die 906b is not used.) DQS-S is transmitted from the bond pad 962a across a signal line 922 to a bond pad 962b in the secondary strobe interface 912b of the slave memory die 906b. (The bond pad 960b is not bonded out, because the primary strobe interface 910b in the slave memory die 906b is not used.) A buffer 966b coupled to the bond pad 962b generates an internal strobe signal DS-S1, which is delayed from DQS-S by an amount $t_{R-S}$. DS-S1 clocks buffers 936b and 944b, which are coupled respectively to bond pads 930b and 934b and which output respective data streams D-S1c and D-S1d. Skip circuits 956 and 958 transition these data streams from a domain clocked by DS-S1 to a domain clocked by a clock signal CK-S1, resulting in data streams D-S1e and D-S1f. Muxes 952b and 954b forward D-S1e and D-S1f to the memory core 908b (e.g., core 108b, FIG. 1), where the data is stored.

Figure 12:
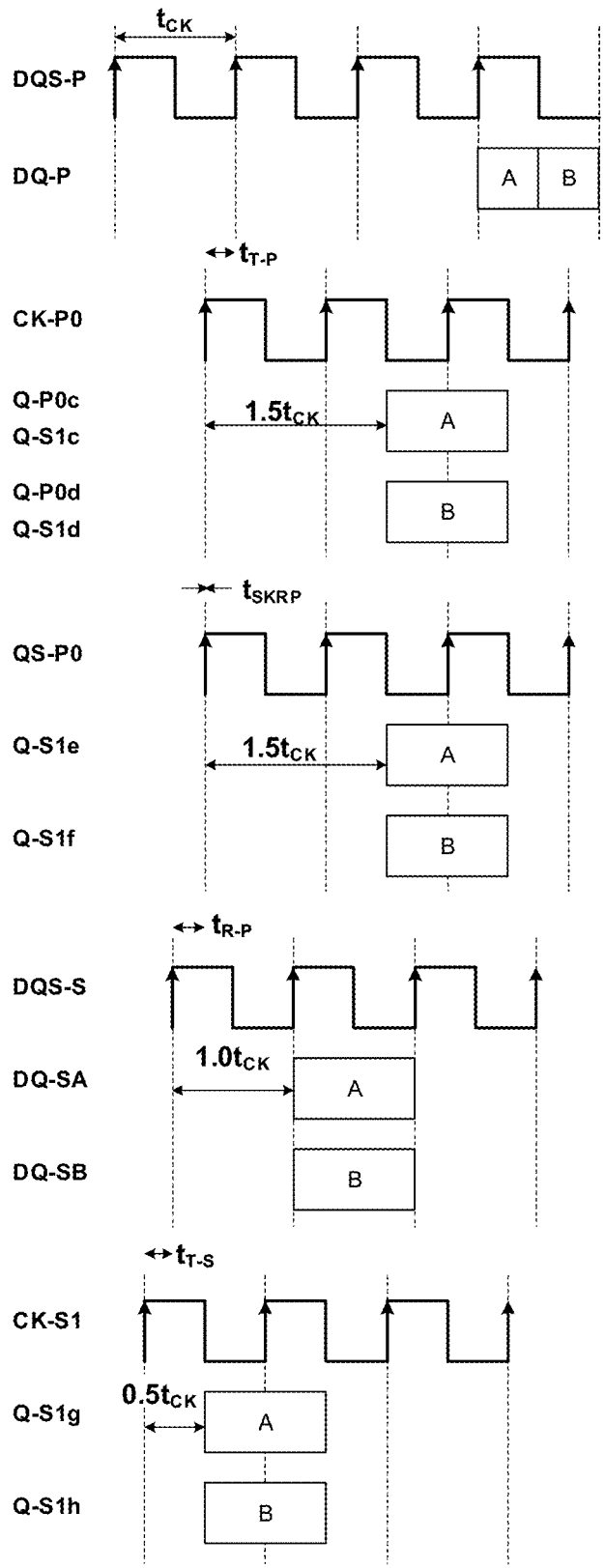
FIG. 12 shows timing diagrams for read operations in the system of FIGS. 11A-11C in accordance with some embodiments.

FIGS. 9A-9C and 10 thus illustrate write operations in the system 900. Attention is now directed to read operations in the system 900. Read-path circuitry is shown in FIGS. 11A-11C and read-path timing is illustrated in FIG. 12 in accordance with some embodiments. During read operations performed by the master memory die 906a, the memory core 908a provides SDR data streams Q-P0c and Q-P0d in response to read commands (e.g., column access commands) directed to the master memory die 906a. Q-P0c includes a data bit A (FIG. 12) in a given clock cycle, while Q-P0c includes a data bit B (FIG. 12) in the same clock cycle. Muxes 972a and 974a receive the data streams Q-P0c and Q-P0d and provide corresponding SDR data streams Q-P0e and Q-P0f to a buffer 942a in the primary data interface 916a. The buffer 942a serializes Q-P0e and Q-P0f into a DDR data stream DQ-P, which is driven through the pad 932a onto the signal line 924 (e.g., signal line 116, FIG. 1). DQ-P is transmitted, for example, to a memory controller 114 (FIG. 1). The primary strobe interface 910a transmits a data strobe DQS-P to accompany DQ-P. A buffer 964a in the primary strobe interface 910a generates DQS-P based on a clock signal CK-P0 and drives DQS-P through the bond pad 960a onto the signal line 920. DQS-P is offset from CK-P0 by an amount $t_{R-P}$. The bits A and B are associated with respective rising and falling edges of DQS-P.

During read operations performed by a slave memory die 906b, the core 908b provides SDR data streams Q-S1g and Q-S1h in response to read (e.g., column access) commands directed to the slave memory die 906b. Q-S1g includes a data bit A in a given clock cycle, while Q-S1h includes a data bit B in the same clock cycle. The data streams Q-S1g and Q-S1h are provided to buffers 938b and 946b in the secondary data interface elements 914b and 918b. (The core 908a in the master memory die 906a may similarly be coupled to buffers 938a and 946a, but these connections are not shown in FIGS. 11A and 11B for simplicity.) The buffers 938b and 946b drive corresponding data streams DQ-SA and DQ-SB through pads 930b and 934b onto signal lines 926 and 928 (e.g., signal lines 118, FIG. 1). At the same time, a buffer 968b in the secondary strobe interface 912b generates a strobe signal DQS-S from a clock signal CK-S1 and drives DQS-S through bond pad 962b onto the signal line 922.

DQ-SA and DQ-SB are respectively received at bond pads 930a and 934a in the secondary data interface elements 914a and 918a of the master memory die 906a and provided to respective buffers 936a and 944a. DQS-S is received at a bond pad 962a in the secondary strobe interface 912a of the master memory die 906a and provided to a buffer 966a, which generates a timing signal QS-P0 based on DQS-S. QS-P0, which is offset from DQS-S by an amount $t_{R-P}$, is used to clock the buffers 936a and 944a, which output data streams Q-S1e and Q-S1f. Skip circuits 970 and 976 transition Q-S1e and Q-S1f from a domain clocked by QS-P0 to a domain clocked by a clock signal CK-P0, resulting in data streams Q-S1c and Q-S1d. Muxes 972a and 974a forward Q-S1c and Q-S1d to the buffer 942a, which is clocked by CK-P0 and which serializes Q-S1c and Q-S1d into a DDR data stream DQ-P. DQ-P is transmitted along with a data strobe DQS-P, as previously described.

Figure 13A:
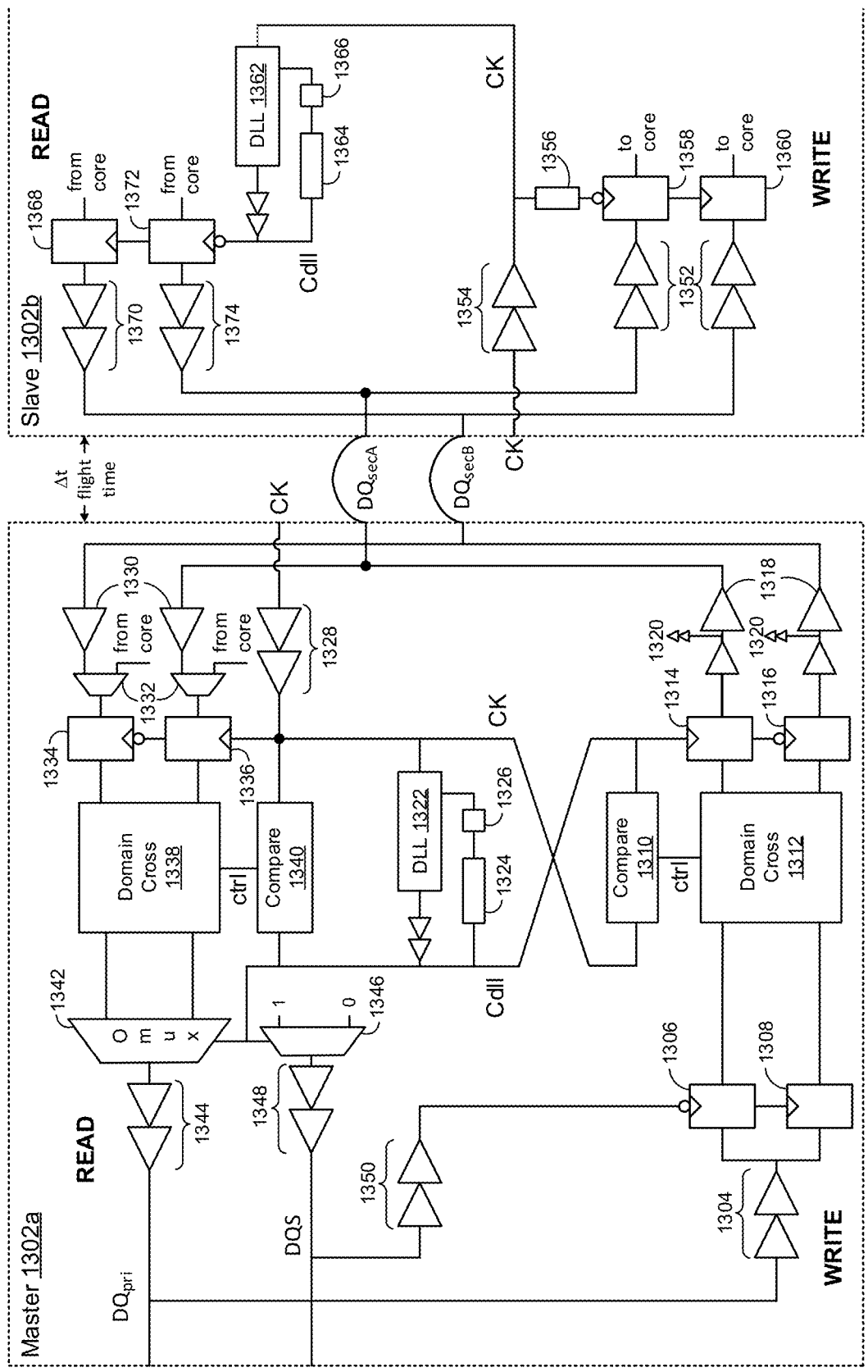
FIGS. 13A and 13B illustrate write and read paths in systems in which both the master memory die and slave memory die include delay-locked loops (DLLs) in accordance with some embodiments.

In some embodiments, timing for data transmission and reception in a master memory die 102a and/or slave memory die 102b (FIG. 1) is controlled using a delay-locked loop (DLL). For example, FIG. 13A illustrates write and read paths in a system 1300 in which both the master memory die 1302a and slave memory die 1302b include DLLs in accordance with some embodiments. The master memory die 1302a receives a clock signal CK (e.g., at a clock input coupled to a clock pin), which is provided through input buffers 1328 to the input of a DLL 1322. The DLL 1322 generates a delayed clock signal Cdll based on CK. A feedback path associated with the DLL 1322 includes a first delay element 1324, which accounts for on-die delays and voltage and temperature (VT) variation of those delays, and a second delay element 1326, which accounts for a flight time Δt between the die 1302a and 1302b and also for CK path variation between the die 1302a and 1302b. While the delay elements 1324 and 1326 are shown as separate elements, their corresponding delays may be implemented in a single delay element.

In the write path of the system 1300, the master memory die 1302a receives DDR data $DQ_{pri}$ (e.g., from a memory controller 114, FIG. 1). Input buffers 1304 receive $DQ_{pri}$ and provide it to flip-flops 1306 and 1308, which deserialize the data into two SDR data streams. The flip-flops 1306 and 1308 are clocked using a strobe signal DQS (e.g., as received from the memory controller 114, FIG. 1). Input buffers 1350 forward DQS to the flip-flops 1306 and 1308. The DQS signal provided to the flip-flop 1306 is inverted with respect to the DQS signal provided to the flip-flop 1308. The flip-flops 1306 and 1308 therefore sample data on alternating edges of DQS, thus deserializing $DQ_{pri}$. The flip-flops 1306 and 1308 are part of a primary data interface 104a (FIG. 1).

A domain crossing circuit 1312 (e.g., a skip circuit) transitions the SDR data streams to a domain clocked by Cdll, where flip-flops 1314 and 1316 latch the data in the respective streams. The domain crossing circuit 1312 is controlled by a compare circuit 1310, which compares CK and Cdll and generates a control signal (ctrl) accordingly. The output of flip-flops 1314 and 1316 is provided to output buffers 1318, which transmit the SDR data streams $DQ_{secA}$ and $DQ_{secB}$ to the slave memory device 1302b. (If, however, a write operation is directed to the master memory die 1302a, then taps 1320 provide the SDR data streams to the memory core of the master memory die 1302a, and the buffers 1318 optionally do not forward the SDR data streams to the slave memory device 1302b.) The flip-flops 1314 and 1316 and buffers 1318 are part of a secondary data interface 106a (FIG. 1).

Input buffers 1352 in the slave memory die 1302b receive the SDR data streams $DQ_{secA}$ and $DQ_{secB}$ and provide them to flip-flops 1358 and 1360, which latch the data during alternating clock cycle portions. The flip-flops 1358 and 1360 are clocked by CK, as provided by buffers 1354 and delayed by the delay circuit 1356. In some embodiments, the slave memory die 1302b receives CK at a clock input coupled to a clock pin. CK as provided to the flip-flop 1358 is inverted with respect to CK as provided to the flip-flop 1360. The delay circuit 1356 (e.g., a controlled delay element, such as a digitally controlled delay line) accounts for the flight time Δt between the die 1302a and 1302b and also for the CK path variation between the die 1302a and 1302b.

In the read path of the system 1300, data from the memory core of the slave memory die 1302b is latched by flip-flops 1368 and 1372 and then transmitted by output buffers 1370 and 1374 as SDR data streams $DQ_{secA}$ and $DQ_{secB}$ to the master memory die 1302a. A DLL 1362 in the slave memory die 1302b generates a clock signal Cdll based on CK. Cdll is used to clock the flip-flops 1368 and 1372, with Cdll as provided to the flip-flop 1372 being inverted with respect to Cdll as provided to the flip-flop 1368. A feedback loop for the DLL 1362 includes delay elements 1364 and 1366, which are analogous to delay elements 1324 and 1326.

In the master memory die 1302a, the data streams $DQ_{secA}$ and $DQ_{secB}$ are forwarded through input buffers 1330 and muxes 1332 to flip-flops 1334 and 1336, which latch the data. (If, however, a read operation is directed to the master memory die 1302a, then the muxes 1332 forward data from the core of the master memory die 1302a instead.) The flip-flops 1334 and 1336 are clocked by opposite edges of CK. The data streams as output by the flip-flops 1334 and 1336 are provided to a domain crossing circuit (e.g., a skip circuit) 1338, which transitions the data streams to a domain clocked by Cdll. The domain crossing circuit 1338 is controlled by a compare circuit 1340, by analogy to compare circuit 1310 and domain cross circuit 1312. An output mux 1342, as clocked by Cdll, receives the data streams from the domain crossing circuit 1338 and serializes them by multiplexing them into a DDR data stream $DQ_{pri}$. The output mux 1342 thus acts as a serializer. Output buffers 1344 transmit the DDR data stream (e.g., to a memory controller 114, FIG. 1). A mux 1346, which is also clocked by Cdll, provides a data strobe signal DQS to output buffers 1348, which transmit DQS alongside $DQ_{pri}$.

The DLLs 1322 and 1362 in the system 1300 provide a constant latency for the secondary data interfaces in the die 1302a and 1302b and perform phase alignment that accounts for VT variation. The DLLs 1322 and 1362 allow for data buffering by the master memory die 1302a without transmission of a data strobe between the master and slave memory die 1302a and 1302b.

Figure 13B:
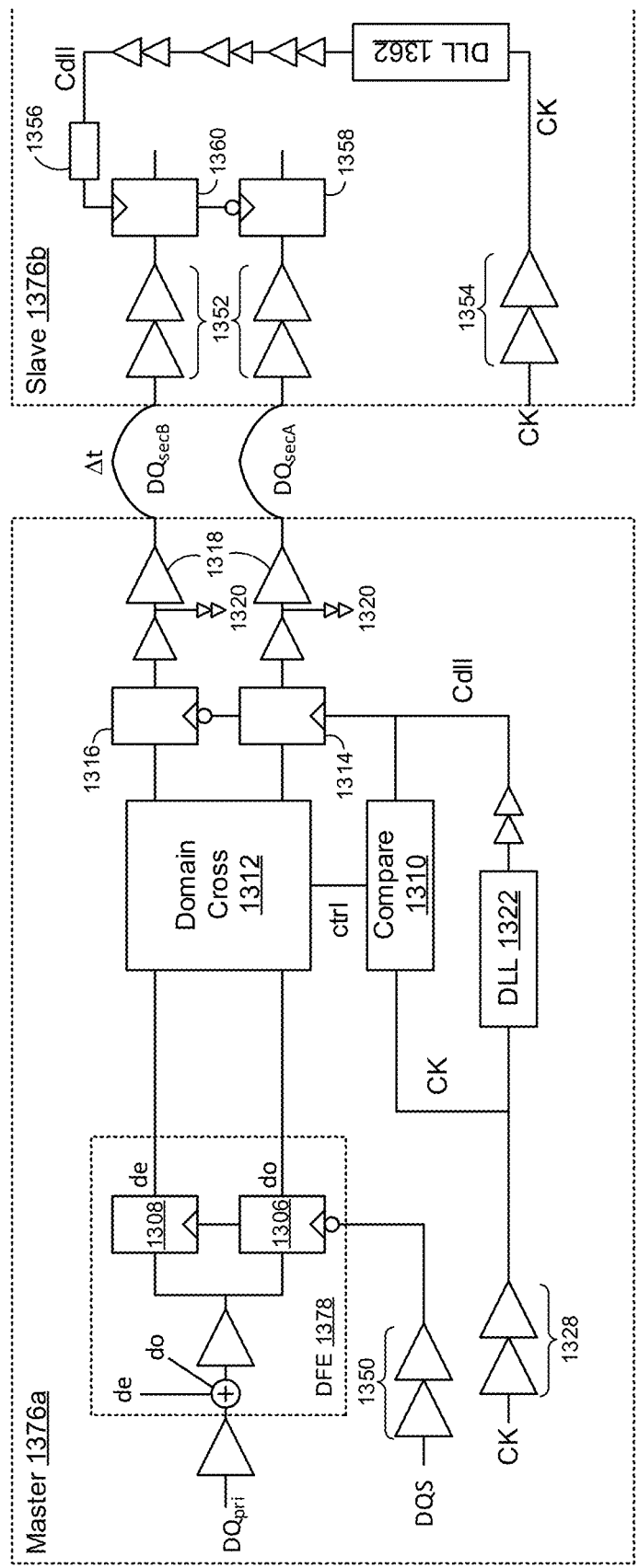

FIG. 13B illustrates variations on the write path of the system 1300 in accordance with some embodiments. The master memory die 1302a (FIG. 13A) is replaced with a master memory die 1376a, which includes a decision-feedback equalizer (DFE) 1378 in its primary data interface 102a (FIG. 1). The slave memory die 1302b (FIG. 13A) is replaced with a slave memory die 1376b, in which the delay circuit 1356 is coupled to the output of the DLL 1362 instead of the CK buffers 1354. The flip-flops 1358 and 1360 that latch the SDR data stream $DQ_{secA}$ and $DQ_{secB}$ are thus clocked by respective edges of Cdll as delayed by the delay circuit 1356.

Figure 14A:
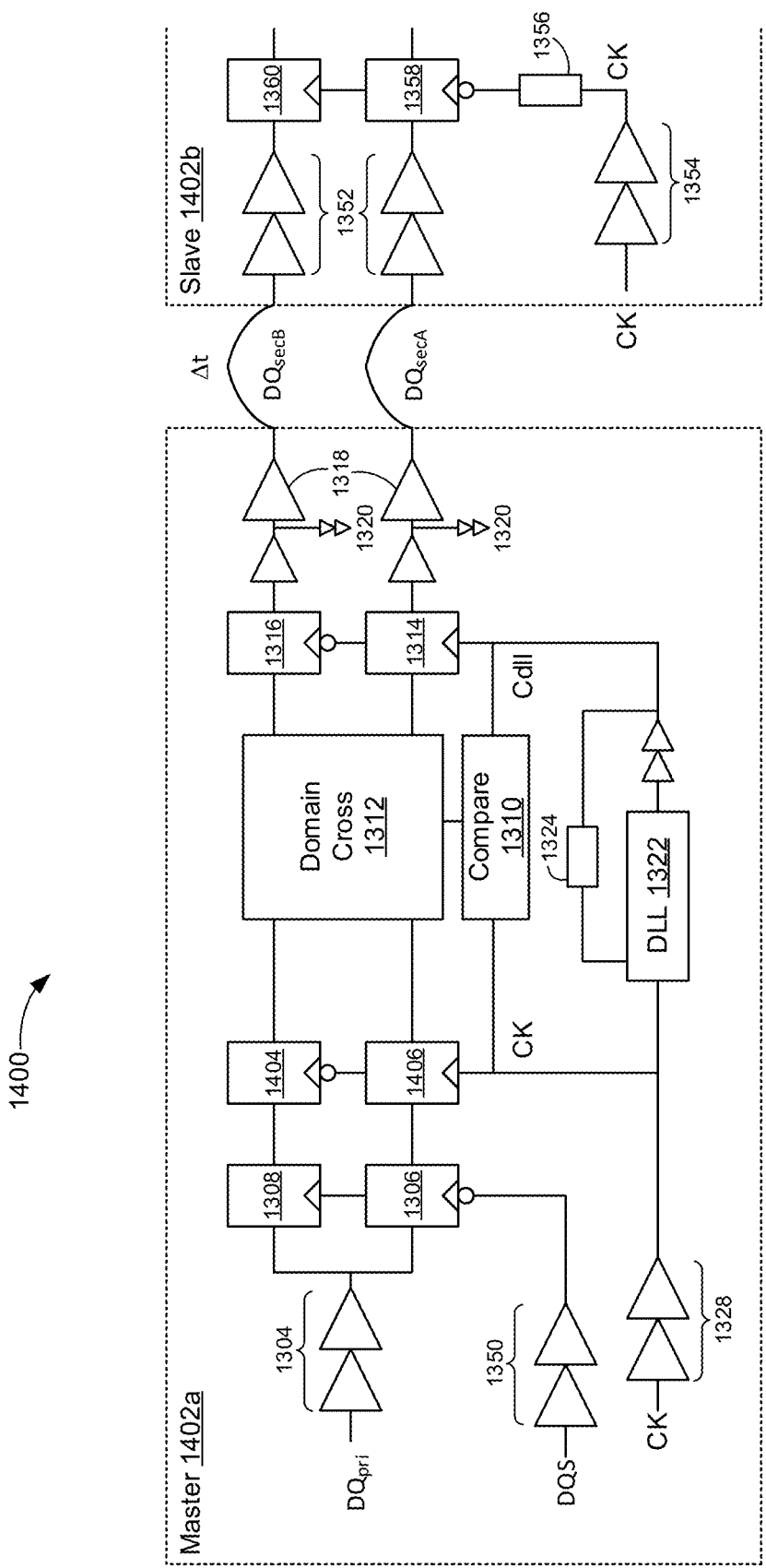
FIGS. 14A and 14B illustrate write paths in systems in which the master memory die includes a DLL in accordance with some embodiments.
Figure 14B:
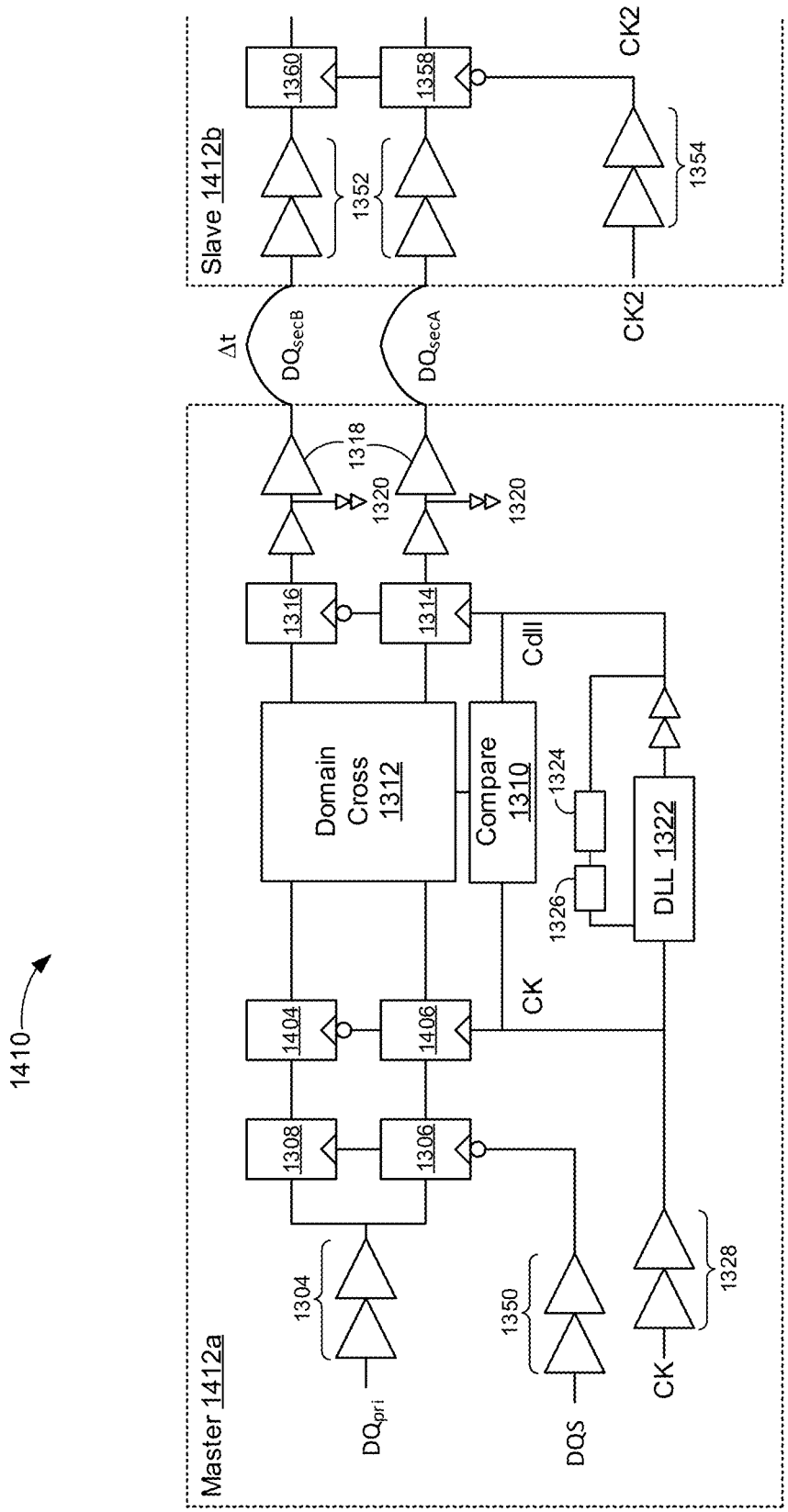

FIG. 14A illustrates a system 1400 with an alternative write path to the write paths in the systems of FIGS. 13A and 13B in accordance with some embodiments. A master memory die 1402a in the system 1400 includes an additional stage of flip-flops 1404 and 1406: the flip-flop 1404 is coupled between the flip-flop 1308 and the domain crossing circuit 1312, and the flip-flop 1406 is coupled between the flip-flop 1306 and the domain crossing circuit 1312. The flip-flops 1404 and 1406 are clocked by alternating edges of the clock signal CK, as provided by the clock input buffers 1328. In this example, the feedback path of the DLL 1322 includes the delay element 1324, which accounts for VT variation on the master memory die 1402a, but does not include the delay element 1326 (FIG. 13A). Instead, the delay element 1356 in the slave memory die 1402b accounts for flight time and clock path variation between the master memory die 1402a and slave memory die 1402b. The write path of the slave memory die 1402b functions as described for the slave memory die 1302b (FIG. 13A). Alternatively, as shown in the system 1410 in FIG. 14B, the delay element 1356 is omitted from the slave memory die 1412b and the delay element 1326 is included in the master memory die 1412a to account for flight time and clock path variation between the two die 1412a and 1412b.

Figure 15A:
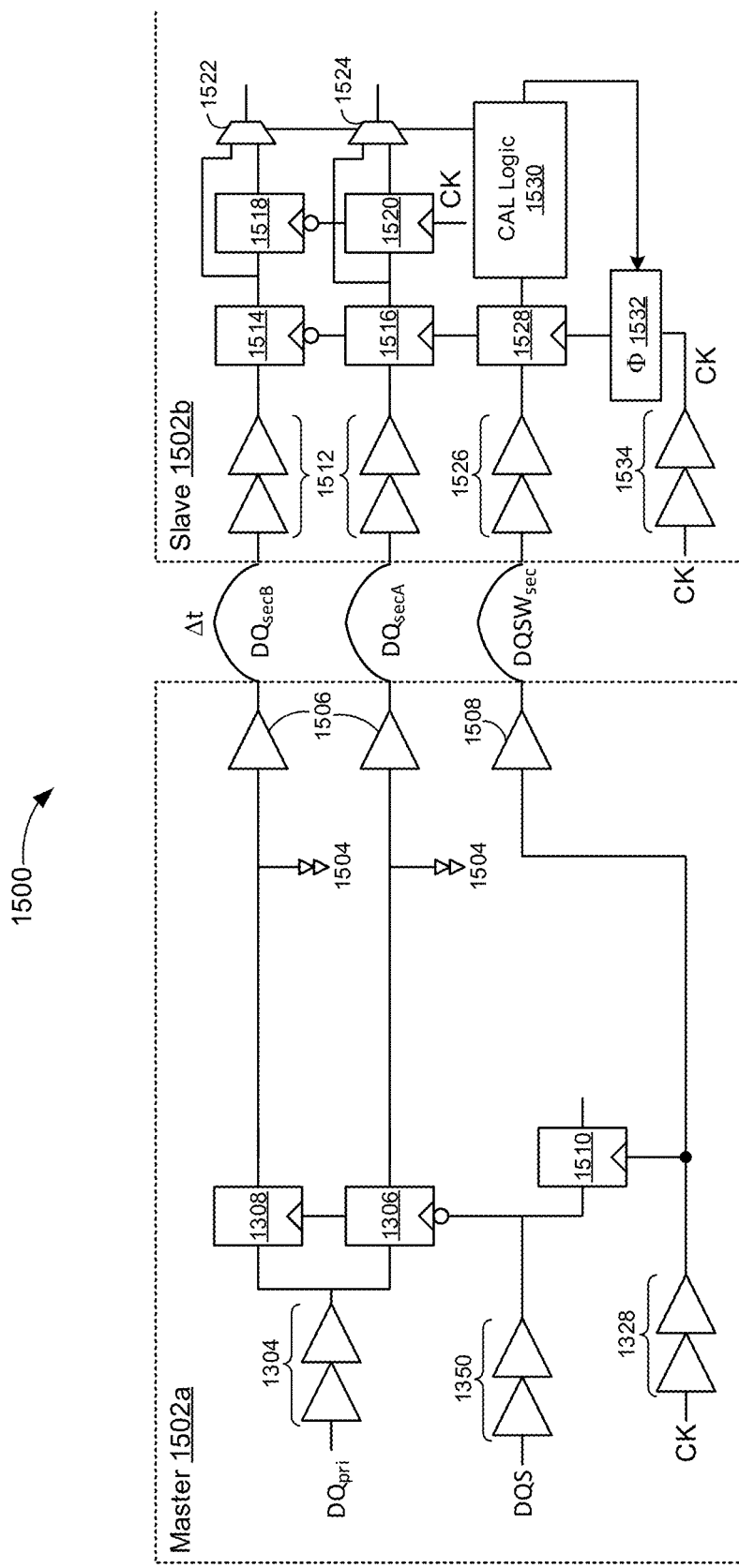
FIGS. 15A and 15B illustrate write paths in systems in which a slave memory die includes one or more controlled delay elements in accordance with some embodiments.

In the examples of FIGS. 13A-13B and 14A-14B, domain-crossing is performed in the master memory die. In other embodiments, domain crossing is performed in the slave memory die. FIG. 15A illustrates a system 1500 in which flip-flops 1306 and 1308 in the primary data interface 104a (FIG. 1) of a master memory die 1502a deserialize DDR data $DQ_{pri}$ into two SDR data streams $DQ_{secA}$ and $DQ_{secB}$, which are transmitted through output buffers 1506 to the slave memory die 1502b, in accordance with some embodiments. The flip-flops 1306 and 1308 are clocked by alternating edges of a data strobe DQS, as provided by input buffers 1350. $DQ_{pri}$ and DQS are received, for example, from a memory controller 114 (FIG. 1). The data streams $DQ_{secA}$ and $DQ_{secB}$ produced by the flip-flops 1306 and 1308 never transition to another clock domain within the master memory die 1502a, and instead are transmitted to the slave memory die 1502b in accordance with DQS. (If, however, a write operation is directed to the master memory die 1502a and not to the slave memory die 1502b, then taps 1504 provide the data streams to the memory core of the master memory die 1502a and the output buffers 1506 may be disabled.) Also in the master memory die 1502a, a flip-flop 1510 latches DQS and forwards DQS to internal control circuitry in accordance with a clock signal CK.

Input buffers 1512 in the slave memory die 1502b receive $DQ_{secA}$ and $DQ_{secB}$ and provide them to flip-flops 1514 and 1516, which latch them on alternating edges of a delayed clock signal CK. CK as provided to the flip-flops 1514 and 1516 is delayed by a delay circuit (e.g., a controlled delay element, for example, a digitally controlled delay line) 1532, which introduces a phase delay as specified by a control signal from calibration logic 1530. The flip-flops 1514 and 1516 provide their respective data streams to flip-flops 1518 and 1520, which are clocked by alternating edges of the clock signal CK. Domain crossing to a CK domain thus occurs in the slave memory die 1502b. A mux 1522 has inputs coupled to the outputs of flip-flops 1514 and 1518 and selects between these inputs based on a control signal from the calibration logic 1530. A mux 1524 similarly has inputs coupled to the outputs of flip-flops 1516 and 1520 and selects between these inputs based on the control signal from the calibration logic 1530. The data streams as output by the muxes 1522 and 1524 are forwarded on to the memory core of the slave memory die 1502b.

An output buffer 1508 in the master memory die 1502a transmits a data strobe $DQSW_{sec}$, generated from the clock signal CK, that accompanies the data streams $DQ_{secA}$ and $DQ_{secB}$. Input buffers 1526 in the slave memory die 1502b forward the data strobe to a flip-flop 1528, which is clocked by the delayed clock signal CK from the delay circuit 1532. The output of the flip-flop 1528 is provided to the calibration logic 1530, which adjusts the control signals for the delay circuit 1532 and muxes 1522 and 1544 accordingly.

Figure 15B:
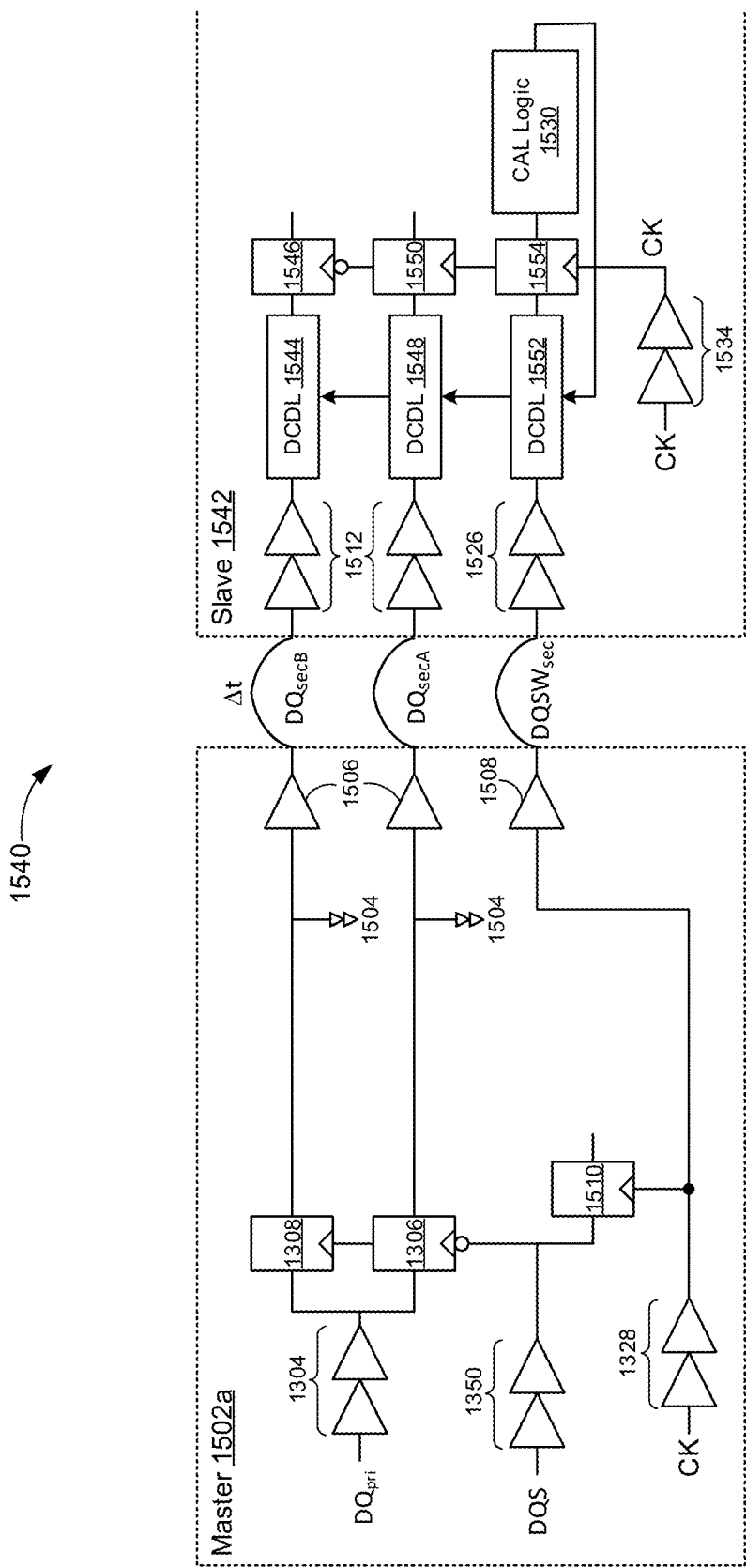

FIG. 15B is a block diagram of an alternative system 1540 in which a slave memory die 1542 coupled to the master memory die 1502a includes controlled delay elements (e.g., digitally controlled delay lines or DCDLs) 1544 and 1548 that replace the controlled delay element 1532 of the slave 1502b (FIG. 15A) in accordance with some embodiments. The delay elements 1544 and 1548 are respectively coupled between the input buffers 1512 and the flip-flops 1546 and 1550. The delay elements 1544 and 1548 thus delay the arrival of the data streams $DQ_{secA}$ and $DQ_{secB}$ at the flip-flops 1546 and 1550, whereas the delay element 1532 (FIG. 15A) delays sampling of the data streams $DQ_{secA}$ and $DQ_{secB}$. The flip-flops 1546 and 1550 are clocked by CK as provided by the clock input buffers 1534. The slave memory die 1542 also includes a controlled delay element (e.g., a DCDL) 1552, coupled between the data strobe input buffers 1526 and the flip-flop 1554, to delay the data strobe. The delay elements 1544, 1548, and 1552 are controlled by the calibration logic 1530, based on the output of the flip-flop 1554 as provided to the calibration logic 1530.

Attention is now directed to methods of operating memory systems such as the memory system 100 (FIG. 1) and the variants of the system 100 that have been described above.

Figure 16A:
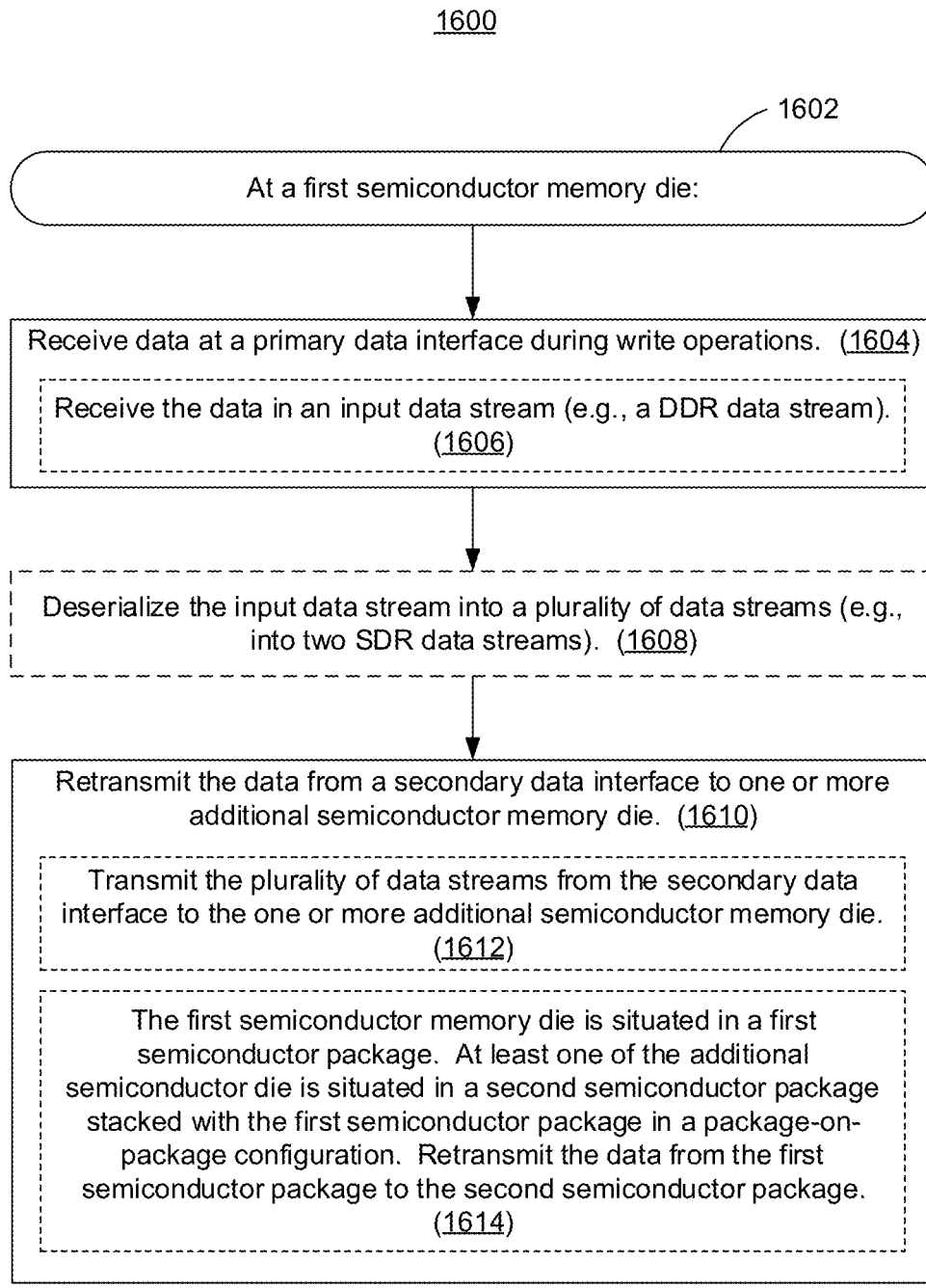
FIG. 16A is a flowchart of a method of performing write operations in a memory system in accordance with some embodiments.

FIG. 16A is a flowchart of a method 1600 of performing write operations in a memory system (e.g., the system 100, FIG. 1) in accordance with some embodiments. The method 1600 is performed (1602) at a first memory die (e.g., a master memory die 102a, FIG. 1).

In the method 1600, the first memory die receives (1604) data at a primary data interface (e.g., primary data interface 104a, FIG. 1) during write operations. The data is received, for example, from a memory controller (e.g., controller 114, FIG. 1). In some embodiments, the data is received in an input data stream (e.g., a DDR data stream).

In some embodiments, the first memory die deserializes (1608) the input data stream into a plurality of data streams (e.g., into two SDR data streams).

The first memory die retransmits (1610) the data from a secondary data interface (e.g., secondary data interface 106a, FIG. 1) to one or more additional semiconductor memory die (e.g., to one or more slave memory die 102b, FIG. 1). In some embodiments, the plurality of data streams is transmitted (1612) from the secondary data interface to the one or more additional semiconductor memory die.

In some embodiments, the first semiconductor memory die is situated in a first semiconductor package and at least one of the additional semiconductor die is situated in a second semiconductor package stacked with the first semiconductor package in a package-on-package configuration. Examples of such configurations are shown in FIGS. 2A and 2B. The data is retransmitted (1614) from the first semiconductor package to the second semiconductor package. For example, at least a portion of the data is retransmitted through a contact (e.g., a conductive pad 632a, FIG. 6B) connecting the first and second semiconductor packages.

FIG. 16B is a flowchart of a method 1650 of performing read operations in a memory system (e.g., the system 100, FIG. 1) in accordance with some embodiments. The method 1650 is performed (1652) at a first semiconductor memory die (e.g., a master memory die 102a, FIG. 1) coupled to one or more additional semiconductor die (e.g., one or more slave memory die 102b, FIG. 1).

During read operations directed at a respective semiconductor memory die of the one or more additional semiconductor memory die, the first semiconductor memory die receives (1654) data from the respective semiconductor memory die at a secondary data interface (e.g., secondary data interface 106a, FIG. 1). In some embodiments, a plurality of data streams (e.g., two SDR data streams) is received (1656).

In some embodiments, the first semiconductor memory die is situated in a first semiconductor package and the respective semiconductor die is situated (1658) in a second semiconductor package stacked with the first semiconductor package in a package-on-package configuration. Examples of such configurations are shown in FIGS. 2A and 2B. The first package receives the data from the second package. For example, the first semiconductor package receives the data through one or more contacts (e.g., conductive pads 630b and 632a, FIG. 6B) connecting the first semiconductor memory die to the respective semiconductor memory die.

In some embodiments, the first semiconductor memory die serializes (1660) the plurality of data streams into an output data stream (e.g., into a DDR data stream).

The first semiconductor memory die transmits (1662) the data (e.g., the output data stream) from a primary data interface (e.g., primary data interface 104a). The data is transmitted, for example, to a memory controller (e.g., controller 114, FIG. 1).

While the methods 1600 and 1650 include a number of operations that appear to occur in a specific order, it should be apparent that the methods 1600 and 1650 can include more or fewer operations, which can be executed serially or in parallel. Two or more operations may be combined into a single operation.

The foregoing description, for purpose of explanation, has been described with reference to specific embodiments. However, the illustrative discussions above are not intended to be exhaustive or to limit all embodiments to the precise forms disclosed. Many modifications and variations are possible in view of the above teachings. The disclosed embodiments were chosen and described to best explain the underlying principles and their practical applications, to thereby enable others skilled in the art to best implement various embodiments with various modifications as are suited to the particular use contemplated.

What is claimed is:

1. A dynamic random access memory (DRAM) die, comprising:
    an array of DRAM storage cells;
    a secondary data interface, in a first mode of operation, to receive a first plurality of data streams from a second DRAM die during an interval associated with read operations; and
    a primary data interface coupled to the secondary data interface, in the first mode of operation, to serialize the first plurality of data streams into a read data stream and to transmit the read data stream to a first integrated circuit (IC) chip.

2. The DRAM die of claim 1, wherein:
    the secondary data interface is to receive the first plurality of data streams at a first single data rate (SDR) during the time interval associated with the read operations; and
    the primary data interface is to transmit the read data stream at a double data rate (DDR) during the time interval associated with the read operations.

3. The DRAM die of claim 1, further comprising:
    configuration circuitry for configuring use of the DRAM die between the first mode of operation and a second mode of operation;
    wherein the DRAM die is configurable to operate as a master die for direct communication with the first IC chip in the first mode of operation and as a minion die for indirect communication with the first IC chip in the second mode of operation.

4. The DRAM die of claim 3, wherein:
    the primary data interface is configurable to serialize the first plurality of data streams into the read data stream and transmit the read data stream in the first mode of operation and to be deactivated in the second mode of operation; and
    the secondary data interface is configurable to receive the first plurality of data streams during the interval associated with the read operations in the first mode of operation and to transmit a second plurality of data streams during the interval associated with the read operations in the second mode of operation.

5. The DRAM die of claim 1, wherein:
    the first IC chip comprises a memory controller IC chip.

6. The DRAM die of claim 1, wherein:
    the primary data interface comprises a first bond pad to transmit the read data stream; and
    the secondary data interface comprises a second bond pad through which to receive a first data stream of the first plurality of data streams and a third bond pad through which to receive a second data stream of the first plurality of data streams.

7. The DRAM die of claim 6, further comprising:
a plurality of through-die vias, coupled to the secondary data interface, to receive the first plurality of data streams.

8. A dynamic random access memory (DRAM) chip package, comprising:
multiple DRAM integrated circuit (IC) chips, a first one of the multiple DRAM IC chips comprising
an array of DRAM storage cells;
a secondary data interface, in a first mode of operation, to receive a first plurality of data streams from a second one of the multiple DRAM IC chips during an interval associated with read operations; and
a primary data interface coupled to the secondary data interface, in the first mode of operation, to serialize the first plurality of data streams into a read data stream and to transmit the read data stream to a memory controller.

9. The DRAM chip package according to claim 8, wherein:
the secondary data interface is to receive the first plurality of data streams at a first single data rate (SDR) during the time interval associated with the read operations; and
the primary data interface is to transmit the read data stream at a double data rate (DDR) during the time interval associated with the read operations.

10. The DRAM chip package according to claim 8, wherein each of the multiple DRAM IC chips further comprises:
configuration circuitry for configuring use of a corresponding DRAM IC chip between the first mode of operation and a second mode of operation;
wherein each of the multiple DRAM IC chips is configurable to operate as a master die for direct communication with the memory controller in the first mode of operation and as a minion die for indirect communication with the memory controller in the second mode of operation.

11. The DRAM chip package according to claim 10, wherein:
the first DRAM IC chip of the multiple DRAM IC chips operates in the first mode of operation; and
the other of the multiple DRAM IC chips operate in the second mode of operation.

12. The DRAM chip package according to claim 10, wherein for each of the multiple DRAM IC chips:
the primary data interface is configurable to serialize the first plurality of data streams into the read data stream and transmit the read data stream in the first mode of operation and to be deactivated in the second mode of operation; and
the secondary data interface is configurable to receive the first plurality of data streams during the interval associated with the read operations in the first mode of operation and to transmit a second plurality of data streams during the interval associated with the read operations in the second mode of operation.

13. The DRAM chip package according to claim 8, wherein for each of the multiple DRAM IC chips:

the primary data interface comprises a first bond pad to transmit the read data stream in the first mode of operation; and
the secondary data interface comprises a second bond pad through which to receive a first data stream of the first plurality of data streams and a third bond pad through which to receive a second data stream of the first plurality of data streams.

14. The DRAM IC chip package according to claim 13, wherein each of the multiple DRAM IC chips further comprises:
a plurality of through-die vias, coupled to the secondary data interface, to receive the first plurality of data streams.

15. A method of operation in a dynamic random access memory (DRAM) integrated circuit (IC) chip, the DRAM IC chip including an array of DRAM storage cells, the method comprising:
in a first mode of operation
receiving a first plurality of data streams with a secondary interface, the first plurality of data streams from a second DRAM IC chip during an interval associated with read operations;
serializing, with a primary data interface, the first plurality of data streams into a read data stream; and
transmitting the read data stream to a first integrated circuit (IC) chip.

16. The method according to claim 15, wherein:
the receiving of the first plurality of data streams is carried out at a first single data rate (SDR) during the time interval associated with the read operations; and
the transmitting of the read data stream is carried out at a double data rate (DDR) during the time interval associated with the read operations.

17. The method according to claim 15, further comprising:
configuring use of the DRAM IC chip between the first mode of operation and a second mode of operation; and
operating the DRAM IC chip as a master die for direct communication with the first IC chip in the first mode of operation and as a minion die for indirect communication with the first IC chip in the second mode of operation.

18. The method according to claim 17, wherein:
the primary data interface is configurable to serialize the first plurality of data streams into the read data stream and transmit the read data stream in the first mode of operation and to be deactivated in the second mode of operation; and
the secondary data interface is configurable to receive the first plurality of data streams during the interval associated with the read operations in the first mode of operation and to transmit a second plurality of data streams during the interval associated with the read operations in the second mode of operation.

19. The method according to claim 15, wherein the first IC chip is embodied as a memory controller IC chip.

20. The method according to claim 15, wherein:
the configuring use of the DRAM IC chip between the first mode of operation and the second mode of operation is carried out in response to a control signal.

* * * * *